US012622003B2

(12) United States Patent
Oganesian et al.

(10) Patent No.: US 12,622,003 B2
(45) Date of Patent: *May 5, 2026

(54) HIGH DENSITY THREE-DIMENSIONAL INTEGRATED CAPACITORS

(71) Applicant: Adeia Semiconductor Solutions LLC, San Jose, CA (US)

(72) Inventors: Vage Oganesian, Sunnyvale, CA (US); Belgacem Haba, Saratoga, CA (US); Ilyas Mohammed, Santa Clara, CA (US); Piyush Savalia, San Jose, CA (US)

(73) Assignee: Adeia Semiconductor Solutions LLC, San Jose, CA (US)

( * ) Notice: Subject to any disclaimer, the term of this patent is extended or adjusted under 35 U.S.C. 154(b) by 15 days.

This patent is subject to a terminal disclaimer.

(21) Appl. No.: 17/316,102

(22) Filed: May 10, 2021

(65) Prior Publication Data

US 2021/0265460 A1     Aug. 26, 2021

Related U.S. Application Data

(60) Continuation of application No. 16/219,225, filed on Dec. 13, 2018, now Pat. No. 11,004,930, which is a (Continued)

(51) Int. Cl.
| | |
|---|---|
| *H10D 1/00* | (2025.01) |
| *H01L 23/48* | (2006.01) |
| *H10D 1/68* | (2025.01) |

(52) U.S. Cl.
CPC .......... *H10D 1/042* (2025.01); *H01L 23/481* (2013.01); *H10D 1/68* (2025.01); *H10D 1/692* (2025.01);

(Continued)

(58) Field of Classification Search
CPC ....... H01L 28/91; H01L 23/481; H01L 28/40; H01L 28/60; H01L 2223/6622;

(Continued)

(56) References Cited

U.S. PATENT DOCUMENTS

| | | | |
|---|---|---|---|
| 4,017,885 | A | 4/1977 | Kendall et al. |
| 4,827,323 | A | 5/1989 | Tigelaar et al. |

(Continued)

FOREIGN PATENT DOCUMENTS

| | | |
|---|---|---|
| CN | 1123513 A | 5/1996 |
| CN | 1471116 A | 1/2004 |

(Continued)

OTHER PUBLICATIONS

International Search Report Application No. PCT/US2011/044026, dated Oct. 25, 2011.

(Continued)

*Primary Examiner* — Mary A Wilczewski
(74) *Attorney, Agent, or Firm* — HG LAW LLP

(57) ABSTRACT

A component includes a substrate and electrically conductive layers formed in contact with the substrate. The substrate can consist essentially of a material having a coefficient of thermal expansion of less than 10 ppm/° C. The substrate can have a surface and an opening extending downwardly therefrom. The electrically conductive layers can include at least first and second pairs of electrically conductive plates and first and second electrodes. The first and second pairs of plates can be connectable with respective first and second electric potentials. The first and second pairs of plates can extend along an inner surface of the opening, each of the plates being separated from at least one adjacent plate by a dielectric layer. The first and second (Continued)

electrodes can be exposed at the surface of the substrate and can be coupled to the respective first and second pairs of plates.

9 Claims, 24 Drawing Sheets

Related U.S. Application Data division of application No. 15/198,524, filed on Jun. 30, 2016, now Pat. No. 10,157,978, which is a division of application No. 13/954,455, filed on Jul. 30, 2013, now Pat. No. 9,431,475, which is a division of application No. 12/964,049, filed on Dec. 9, 2010, now Pat. No. 8,502,340.

(52) U.S. Cl.
CPC ..... *H10D 1/716* (2025.01); *H01L 2223/6622* (2013.01); *H01L 2924/0002* (2013.01); *H01L 2924/09701* (2013.01)

(58) Field of Classification Search
CPC ... H01L 2924/0002; H01L 2924/09701; H01L 21/768; H01L 21/8239; H01L 27/108; H01L 27/102; H01L 27/1022; H01L 21/02; H10B 12/00; H10B 99/00; H10D 1/042; H10D 1/16; H10D 1/68; H10D 1/692; H10D 1/716
See application file for complete search history.

(56) References Cited

U.S. PATENT DOCUMENTS

| | | | |
|---|---|---|---|
| 5,256,587 | A | 10/1993 | Jun et al. |
| 5,500,385 | A | 3/1996 | Wendt et al. |
| 5,745,333 | A | 4/1998 | Frankeny et al. |
| 5,759,903 | A | 6/1998 | Lehmann et al. |
| 5,866,452 | A | 2/1999 | Willer et al. |
| 6,432,765 | B1 | 8/2002 | Keller et al. |
| 6,437,385 | B1 | 8/2002 | Bertin et al. |
| 6,492,599 | B1 | 12/2002 | Sugihara |
| 6,498,381 | B2 | 12/2002 | Halahan et al. |
| 6,559,004 | B1 | 5/2003 | Yang et al. |
| 6,559,069 | B2 | 5/2003 | Goldbach et al. |
| 6,565,730 | B2 | 5/2003 | Chakravorty et al. |
| 6,693,024 | B2 | 2/2004 | Lehmann et al. |
| 6,710,998 | B1 | 3/2004 | Saito et al. |
| 6,784,519 | B2 | 8/2004 | Iwamoto et al. |
| 6,963,483 | B2 | 11/2005 | Chakravorty et al. |
| 7,030,481 | B2 | 4/2006 | Chudzik et al. |
| 7,105,403 | B2 | 9/2006 | Graettinger et al. |
| 7,608,904 | B2 | 10/2009 | Sinha |
| 7,626,257 | B2 | 12/2009 | Knorr |
| 7,629,249 | B2 | 12/2009 | Borthakur |
| 7,633,112 | B2 | 12/2009 | Won et al. |
| 7,645,669 | B2 | 1/2010 | Hsu et al. |
| 7,666,788 | B2 | 2/2010 | Sinha |
| 7,705,422 | B2 * | 4/2010 | Furumiya ............... H01L 28/87 |
| | | | 257/532 |
| 7,927,990 | B2 | 4/2011 | Hsia et al. |
| 8,085,522 | B2 | 12/2011 | Sasaki et al. |
| 8,330,272 | B2 | 12/2012 | Haba |
| 8,502,340 | B2 * | 8/2013 | Oganesian ............. H01L 28/40 |
| | | | 257/532 |
| 8,598,695 | B2 | 12/2013 | Oganesian et al. |
| 8,697,569 | B2 | 4/2014 | Oganesian et al. |
| 8,722,503 | B2 | 5/2014 | Korec et al. |
| 8,722,505 | B2 | 5/2014 | Hopper et al. |
| 8,742,541 | B2 | 6/2014 | Mohammed et al. |
| 9,190,463 | B2 | 11/2015 | Mohammed et al. |
| 9,196,672 | B2 * | 11/2015 | Tran ........................ H01L 28/40 |
| 9,431,475 | B2 * | 8/2016 | Oganesian ............. H01L 28/91 |
| 9,437,557 | B2 | 9/2016 | Mohammed et al. |
| 9,521,794 | B2 | 12/2016 | Sibuet |
| 10,157,978 | B2 * | 12/2018 | Oganesian .............. H01L 28/40 |
| 11,004,930 | B2 * | 5/2021 | Oganesian .............. H01L 28/91 |
| 2002/0109175 | A1 | 8/2002 | Iwamoto et al. |
| 2002/0185671 | A1 | 12/2002 | Kim |
| 2003/0036244 | A1 | 2/2003 | Jones et al. |
| 2004/0108587 | A1 | 6/2004 | Chudzik et al. |
| 2005/0026361 | A1 | 2/2005 | Graettinger et al. |
| 2005/0133903 | A1 | 6/2005 | Palanduz |
| 2005/0266652 | A1 | 12/2005 | Chudzik et al. |
| 2006/0001174 | A1 | 1/2006 | Matsui |
| 2006/0115952 | A1 * | 6/2006 | Wu .................... H10B 12/0335 |
| | | | 257/E21.59 |
| 2007/0032061 | A1 | 2/2007 | Farnworth et al. |
| 2007/0035030 | A1 | 2/2007 | Horton et al. |
| 2007/0131997 | A1 | 6/2007 | Ohtsuka et al. |
| 2007/0273005 | A1 | 11/2007 | Hwang |
| 2008/0237794 | A1 | 10/2008 | Shoji |
| 2008/0246136 | A1 | 10/2008 | Haba et al. |
| 2009/0267183 | A1 | 10/2009 | Temple et al. |
| 2010/0032800 | A1 | 2/2010 | Hanke et al. |
| 2010/0052099 | A1 | 3/2010 | Chang et al. |
| 2010/0127346 | A1 | 5/2010 | DeNatale et al. |
| 2010/0181645 | A1 | 7/2010 | Marenco |
| 2010/0207246 | A1 | 8/2010 | Booth, Jr. et al. |
| 2012/0018863 | A1 | 1/2012 | Oganesian et al. |
| 2012/0018868 | A1 | 1/2012 | Oganesian et al. |
| 2012/0018893 | A1 | 1/2012 | Oganesian et al. |
| 2012/0018894 | A1 | 1/2012 | Oganesian et al. |
| 2012/0020026 | A1 | 1/2012 | Oganesian et al. |
| 2012/0061798 | A1 | 3/2012 | Wong et al. |
| 2012/0068327 | A1 * | 3/2012 | Oganesian ........ H01L 23/49838 |
| | | | 257/E21.597 |
| 2012/0104548 | A1 | 5/2012 | Hopper et al. |
| 2012/0146182 | A1 | 6/2012 | Oganesian et al. |
| 2012/0181658 | A1 | 7/2012 | Mohammed et al. |
| 2013/0313680 | A1 | 11/2013 | Oganesian et al. |
| 2014/0273393 | A1 | 9/2014 | Mohammed et al. |
| 2015/0102464 | A1 | 4/2015 | Kang et al. |
| 2016/0079189 | A1 | 3/2016 | Mohammed et al. |
| 2016/0315139 | A1 | 10/2016 | Oganesian et al. |
| 2019/0131387 | A1 | 5/2019 | Oganesian et al. |
| 2021/0265460 | A1 * | 8/2021 | Oganesian .............. H01L 28/60 |

FOREIGN PATENT DOCUMENTS

| | | | | |
|---|---|---|---|---|
| CN | 101238572 | A | 8/2008 | |
| CN | 101305448 | A | 11/2008 | |
| CN | 101359537 | A | 2/2009 | |
| EP | 1227515 | A2 | 7/2002 | |
| JP | H07326715 | A | 12/1995 | |
| JP | 2001233669 | A | 8/2001 | |
| JP | 2007516589 | | 6/2007 | |
| JP | 2008251972 | A | 10/2008 | |
| JP | 2009-503906 | * | 1/2009 | ....... H01L 21/76898 |
| JP | 2009049212 | | 3/2009 | |
| JP | 2009054980 | A | 3/2009 | |
| JP | 2009076850 | A | 4/2009 | |
| JP | 2009515356 | | 4/2009 | |
| JP | 05-198741 | | 5/2013 | |
| KR | 10-2001-0030385 | A | 4/2001 | |
| KR | 2003-0086594 | | 10/2002 | |
| KR | 2005-0019000 | A | 2/2005 | |
| KR | 2006-0105797 | A | 10/2006 | |
| KR | 2008-0043139 | A | 5/2008 | |
| WO | 2002/78087 | A2 | 10/2002 | |
| WO | 2007054870 | A1 | 5/2007 | |
| WO | 2012079013 | A1 | 6/2012 | |

OTHER PUBLICATIONS

Office Action from Korean Application No. 10-2011-0104751 dated Nov. 11, 2011.
International Search Report, PCT/US2011/044026, dated Jan. 17, 2012.
International Search Report and Written Opinion for Application No. PCT/US2011/064219 dated May 22, 2012.

(56) References Cited

OTHER PUBLICATIONS

Japanese Office Action for Application No. 2013-543160 dated Mar. 20, 2015.

Japanese Office Action for Application No. 2013-543385 dated Oct. 2, 2015.

"A Novel Modeling Technique for Efficiently Computing 3-D Capacitances of VLSI Multilevel Interconnections-BFEM", by Hsin-Ming Hou, Student Member, IEEE, Chin-Shown Sheen, Student Member, IEEE, and Ching-Yuan Wu, Member, IEEE; IEEE Transactions on Electronic Devices, vol. 45, No. 1, Jan. 1998.

"SrTiO3 Thin Film Decoupling Capacitors on Si Interposers for 3D System Integration", by Koichi Takemura, Katsuya Kikuchi, Chihiro Ueda, Kazuhiro Baba, Masahiro Aoyagi, Kanji Otsuka; 2009 IEEE.

Chinese Search Report for Application No. 201710096957.4 dated Aug. 27, 2019, 3 pages.

Extended European Search Report and Search Opinion received for European Application No. 22187946.3, mailed on Aug. 2, 2023, 11 pages.

International Preliminary Report on Patentability received for PCT Patent Application No. PCT/US11/44026, mailed on Jun. 20, 2013, 12 pages.

International Preliminary Report on Patentability received for PCT Patent Application No. PCT/US11/64219, mailed on Jun. 20, 2013, 17 pages.

International Search Report and Written Opinion received for PCT Patent Application No. PCT/US11/44026, mailed on Jan. 17, 2012, 17 pages.

* cited by examiner

FIG. 19A
FIG. 19B
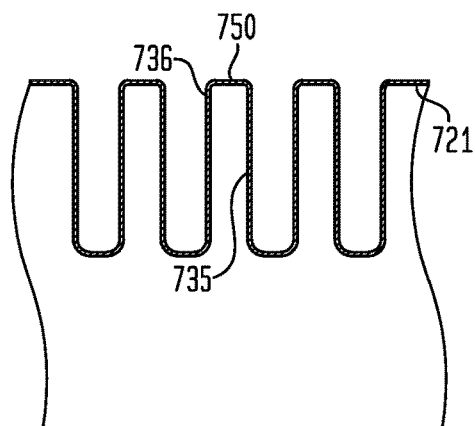
FIG. 19C
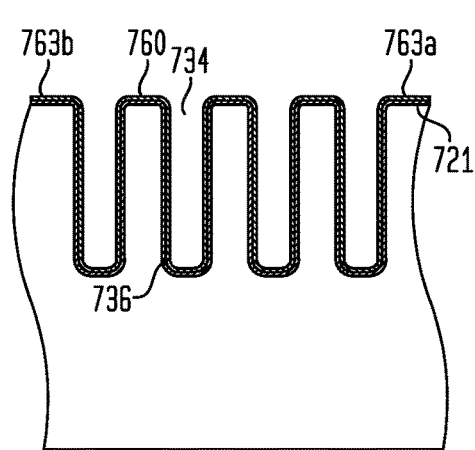
FIG. 19D
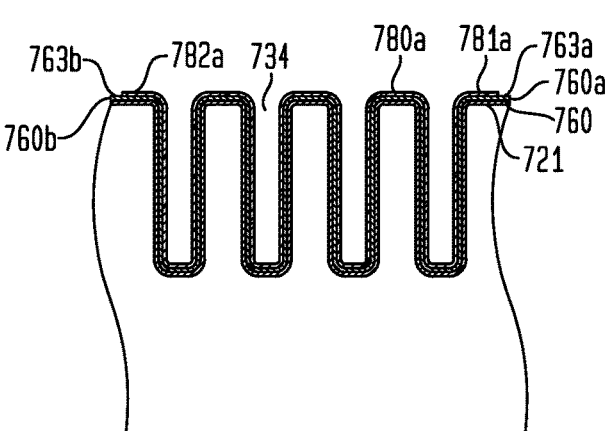
FIG. 19E
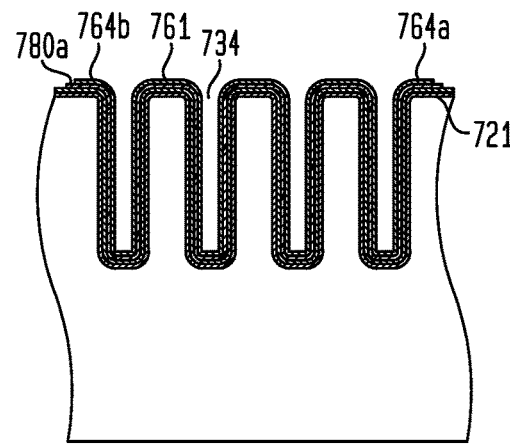

HIGH DENSITY THREE-DIMENSIONAL INTEGRATED CAPACITORS

CROSS-REFERENCE TO RELATED APPLICATIONS

This application is a continuation of U.S. patent application Ser. No. 16/219,225, filed on Dec. 13, 2018, which is a divisional of U.S. patent application Ser. No. 15/198,524, filed on Jun. 30, 2016, now U.S. Pat. No. 10,157,978, which is a divisional of U.S. patent application Ser. No. 13/954, 455, filed on Jul. 30, 2013, now U.S. Pat. No. 9,431,475, which is a divisional of U.S. patent application Ser. No. 12/964,049, filed on Dec. 9, 2010, now U.S. Pat. No. 8,502,340, the disclosures of which are incorporated herein by reference.

BACKGROUND OF THE INVENTION

The present invention relates to capacitors in semiconductor chips or particular types of substrates, e.g., semiconductor, glass, ceramic, or other relatively low CTE materials and methods of making such capacitors, and to components useful in such capacitors.

Capacitors are commonly used for noise suppression, either in signal lines or in power lines. In power lines, noise suppression can be accomplished by mounting many capacitors along the power line to reduce the impedance level. Such capacitor mounting can increase the size and cost of the system, because the cost of mounting the capacitors can be higher than the cost of the capacitors.

Capacitors can be provided on semiconductor chips having active circuit elements, i.e., "active chips" or can be provided on passive chips containing passive circuit elements such as capacitors, inductors, resistors, etc., for mounting to active chips.

Conventional capacitors in silicon can be of two general types. A first type is used to store charge for each bit in a DRAM chip. A second type is capacitors on passive chips, where the primary focus has been on planar capacitors with very thin dielectric materials having a very high dielectric constant, in a single or multi-layer format. Both types of conventional capacitors can have limitations when applied to decoupling capacitor applications. The first type of capacitor may not be well suited for high capacitance applications, because that type is typically meant for usage at bit level and therefore is purposely designed to have a very small size. The first type typically lacks features needed to store or supply sufficient current as a decoupling capacitor. The second type of capacitor may have a low capacitance density and a low quality factor (efficiency).

Further improvements would be desirable in the design of capacitors in microelectronic chips, semiconductor substrates, or other substrates having relatively low CTE such as glass or ceramic material.

BRIEF SUMMARY OF THE INVENTION

In accordance with an aspect of the invention, a component having electrodes for electrical interconnection with a circuit component or microelectronic element can include a substrate and a first capacitor formed in contact with the substrate. The substrate can consist essentially of a material having a coefficient of thermal expansion of less than 10 ppm/° C. The substrate can have a first surface, a second surface opposite the first surface, and a first opening extending downwardly from the first surface. The first capacitor can include at least first and second pairs of electrically conductive plates connectable with respective first and second electric potentials. The first and second pairs of plates can extend along an inner surface of the first opening. Each of the plates can be separated from at least one adjacent plate by a dielectric layer. The first capacitor can include first and second electrodes. The first electrode can be exposed at the first surface and can be coupled to the first pair of plates. The second electrode can be exposed at one of the first and second surfaces and can be coupled to the second pair of plates.

In a particular embodiment, each dielectric layer separating each of the plates from the at least one adjacent plate can be a dielectric layer having a dielectric constant k of at least 3. In one embodiment, a portion of the first opening that is not occupied by the first and second pairs of plates and the dielectric layers can be filled with a dielectric material. In an exemplary embodiment, the substrate can consist essentially of one material selected from the group consisting of: semiconductor, glass, and ceramic. In a particular embodiment, the first capacitor can have a capacitance of at least 1 picoFarad. In one embodiment, the first opening can have a width in a direction along the first surface of at least 5 microns. In an exemplary embodiment, the first opening can have a depth in a direction perpendicular to the first surface of at least 10 microns.

In one embodiment, the first opening can have a frusto-conical shape, the inner surface of the first opening extending at an angle of less than 80 degrees relative to the substrate first surface. In a particular embodiment, the first and second electrodes can be connected to the first and second pairs of plates at respective first and second locations, the second electrode being exposed at the first surface. The first capacitor can further include third and fourth electrodes connected to the first and second pairs of plates at respective third and fourth locations. In an exemplary embodiment, the first pair of plates can have a long dimension extending between the first and third locations, and the second pair of plates can have a long dimension extending between the second and fourth locations. In one embodiment, the connection of the third and fourth electrodes to the respective first and second pairs of plates can provide reduced inductance for the first capacitor.

In an exemplary embodiment, the first opening can have a length dimension extending substantially parallel to the first surface and a width dimension extending substantially parallel to the first surface and substantially perpendicular to the length dimension, the length dimension being greater than the width dimension. In a particular embodiment, the first opening can have a length dimension extending substantially parallel to the first surface and a width dimension extending substantially parallel to the first surface and substantially perpendicular to the length dimension, the length dimension being substantially equal to the width dimension. In one embodiment, the substrate can have a second surface opposite the first surface and the first opening can extend only partially through a thickness of the substrate from the first surface towards the second surface.

In a particular embodiment, the first opening can extend between the first and second surfaces through a thickness of the substrate. In an exemplary embodiment, the first and second pairs of plates can extend between the first and second surfaces through the first opening. In one embodiment, the first capacitor can further include third and fourth electrodes exposed at the second surface and respectively coupled to the first and second pairs of plates, the second electrode being exposed at the first surface. In a particular embodiment, the first and second pairs of plates of the first capacitor and first and second pairs of plates of a second capacitor can extend between the first and second surfaces through the first opening, the first and second capacitors being insulated from one another within the first opening.

In one embodiment, the first and second pairs of plates of each capacitor may not extend above the first surface or below the second surface, the second electrode being exposed at the second surface. In an exemplary embodiment, the first plate can consist essentially of a first metal and the second plate can consist essentially of a second metal different from the first metal. In a particular embodiment, the substrate can have a plurality of openings including the first opening and at least one second opening extending downwardly from the first surface. The first and second pairs of plates can extend along an inner surface of each second opening and along portions of the substrate between each of the plurality of openings. In one embodiment, a portion of each of the plurality of openings that is not occupied by the first and second pairs of plates and the dielectric layers can be filled with a dielectric material. In an exemplary embodiment, each of the plurality of openings may extend only partially through a thickness of the substrate from the first surface towards the second surface.

In accordance with another aspect of the invention, a component having electrodes for electrical interconnection with a circuit component or microelectronic element can include a substrate and a capacitor. The substrate can consist essentially of a material having a coefficient of thermal expansion of less than 10 ppm/° C. The substrate can have a first surface, a second surface opposite the first surface, and an opening in the first surface having at least one dimension greater than 5 microns in a direction along the first surface, the opening extending downwardly from the first surface. The capacitor can include first and second electrically conductive plates connectable with respective first and second electric potentials. The first and second plates can extend along an inner surface of the opening. The first and second plates can be separated from one another by a dielectric layer. The capacitor can include first and second electrodes. The first electrode can be exposed at the first surface and can be coupled to the first plate. The second electrode can be exposed at one of the first and second surfaces and can be coupled to the second plate.

In an exemplary embodiment, the first and second electrodes can be connected to the first and second plates at respective first and second locations, the second electrode being exposed at the first surface. The capacitor can further include third and fourth electrodes connected to the first and second plates at respective third and fourth locations. In one embodiment, the first plate can have a long dimension extending between the first and third locations, and the second plate can have a long dimension extending between the second and fourth locations. In a particular embodiment, the first plate can be grounded to the substrate.

In one embodiment, the first plate can be a conductive portion of the substrate extending inward from the inner surface of the opening. In an exemplary embodiment, the opening can extend between the first and second surfaces through a thickness of the substrate. In a particular embodiment, the first and second pairs of plates can extend between the first and second surfaces through the opening. In one embodiment, the capacitor can further include third and fourth electrodes exposed at the second surface and respectively coupled to the first and second pairs of plates, the second electrode being exposed at the first surface.

In accordance with yet another aspect of the invention, a capacitor can include a substrate having a first surface, a second surface remote from the first surface, and a through opening extending between the first and second surfaces, first and second metal elements, first and second electrodes, and a capacitor dielectric layer. The first metal element can be exposed at the first surface and can extend into the through opening. The first electrode can be connected to the first metal element. The second metal element can be exposed at the second surface and extending into the through opening. The second electrode can be connected to the second metal element. The first and second electrodes can be connectable to first and second electric potentials. The capacitor dielectric layer can separate and insulate the first and second metal elements from one another at least within the through opening.

The capacitor dielectric layer can have an undulating shape.

In a particular embodiment, the capacitor dielectric layer can have a dielectric constant k of at least 3. In an exemplary embodiment, upper and lower surfaces of the capacitor dielectric layer each can have a length at least triple the height of the opening between the first and second surfaces. In one embodiment, each of the first and second metal elements can have a surface that conforms to a contour of a surface of the capacitor dielectric layer. In a particular embodiment, a portion of the opening that is not occupied by the first and second metal elements and the capacitor dielectric layer can be filled with a dielectric material.

In an exemplary embodiment, each of the first and second metal elements can have a first portion that is separated from an adjacent second portion that is substantially parallel to the first portion by the dielectric material. In one embodiment, the first and second metal elements can include a respective plurality of first and second plates, each of the first and second plates extending into the opening. In a particular embodiment, each of the first and second plates can have a width in a direction along the first surface of at least 5 microns.

In accordance with still another aspect of the invention, a capacitor structure can include a substrate having a first surface, a second surface remote from the first surface, and a through opening extending between the first and second surfaces, first, second, third, and fourth metal elements, first, second, third, and fourth electrodes, and an insulating dielectric layer. The first and second metal elements can be exposed at the first surface and can extend into the through opening. A first capacitor dielectric layer can separate and insulate the first and second metal elements from one another at least within the through opening. The third and fourth metal elements can be exposed at the second surface and can extend into the through opening. A second capacitor dielectric layer can separate and insulate the third and fourth metal elements from one another at least within the through opening. The first, second, third and fourth electrodes can be connected to the respective first, second, third, and fourth metal elements, the first and third electrodes being connectable to respective first and second electric potentials. The insulating dielectric layer can separate and insulate the second and third metal elements from one another at least within the through opening. The insulating dielectric layer can have an undulating shape.

In one embodiment, the first and second metal elements and the first capacitor dielectric layer can define a first capacitor, and the third and fourth metal elements and the second capacitor dielectric layer can define a second capacitor. In a particular embodiment, the second and fourth electrodes can be connectable to respective third and fourth electric potentials. In an exemplary embodiment, a portion of the opening that is not occupied by the metal elements and the dielectric layers can be filled with a dielectric material. In one embodiment, each of the first and fourth metal elements can have a first portion that is separated from an adjacent second portion that is substantially parallel to the first portion by the dielectric material.

In a particular embodiment, each of the first and second capacitor dielectric layers can have a dielectric constant k of at least 3. In one embodiment, each of the upper and lower surfaces of the insulating dielectric layer within the opening can have at least one dimension having at least triple the height of the opening between the first and second surfaces. In an exemplary embodiment, the first and second plates can include respective fifth and sixth electrodes exposed at the first surface, and the third and fourth plates can include respective seventh and eighth electrodes exposed at the second surface.

In accordance with yet another aspect of the invention, method of fabricating a component having electrodes for electrical interconnection with a circuit component or microelectronic element can include the steps of removing material from a first surface of a substrate consisting essentially of a material having a coefficient of thermal expansion of less than 10 ppm/° C. to form a plurality of first openings extending from the first surface towards a second surface opposite the first surface, the first openings defining an undulating inner surface, forming a dielectric layer overlying the inner surface, the dielectric layer having an undulating first surface facing away from the inner surface, forming a first electrically conductive element overlying the first surface of the dielectric layer and extending into each of the first openings, removing material of the substrate between adjacent ones of the plurality of first openings so as to expose an undulating second surface of the dielectric layer to form a plurality of second openings extending from the second surface towards the first surface, and forming a second electrically conductive element overlying the second surface of the dielectric layer and extending into each of the second openings.

In an exemplary embodiment, the method can further include the step of forming first and second electrodes connected to the respective first and second conductive elements. The first and second electrodes can be exposed at the respective first and second surfaces. The first and second electrodes can be connectable to respective first and second electric potentials. In one embodiment, the step of forming the dielectric layer can be performed by aqueous plating of a flowable dielectric material onto the inner surface exposed within each first opening. In a particular embodiment, the method can further include, before the step of removing material of the substrate between adjacent ones of the plurality of first openings, the step of removing material from the second surface of the substrate, such that a thickness of the substrate between the first and second surfaces is reduced. In an exemplary embodiment, the step of removing material from the second surface of the substrate can be performed such that a surface of the first conductive element can be exposed at the second surface.

In a particular embodiment, the step of forming the first conductive element can include forming a plurality of first plates, each of first plates extending into a respective one of the first openings. The step of forming the second conductive element can include forming a plurality of second plates, each of the second plates extending into a respective one of the second openings. In one embodiment, the step of forming the dielectric layer can form a capacitor dielectric layer. In an exemplary embodiment, the step of forming the dielectric layer can form an insulating dielectric layer. In a particular embodiment, the method can further include the steps of forming a first capacitor dielectric layer overlying a surface of the first conductive element at least within each of the first openings, forming a second capacitor dielectric layer overlying a surface of the second conductive element at least within each of the second openings, forming a third electrically conductive element overlying a surface of the first capacitor dielectric layer at least within each of the first openings, and forming a fourth electrically conductive element overlying a surface of the second capacitor dielectric layer at least within each of the second openings.

In one embodiment, the method can further include the step of forming third and fourth electrodes connected to the respective third and fourth conductive elements. The third and fourth electrodes can be exposed at the respective first and second surfaces. The third and fourth electrodes can be connectable to respective third and fourth electric potentials. In a particular embodiment, the method can further include the steps of forming a first dielectric region overlying the third conductive element, such that the first dielectric region fills at least a portion of each first opening that is not occupied by the first and third conductive plates and the first capacitor dielectric layer, and forming a second dielectric region overlying the fourth conductive element, such that the second dielectric region fills at least a portion of each second opening that is not occupied by the second and fourth conductive plates and the second capacitor dielectric layer.

Further aspects of the invention provide systems which incorporate capacitor structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

BRIEF DESCRIPTION OF THE DRAWINGS

FIGS. 19A-19M are sectional views illustrating stages of fabrication in accordance with the embodiment of the invention depicted in FIG. 18.

DETAILED DESCRIPTION

A capacitor can be composed of conductors, and the wider the conductors are with respect to the current flow, the lower the inductance can be. Another way to achieve a lower inductance can be to have a ground layer of the capacitor be relatively close to the input/output layer. In a two-terminal capacitor as in one or more embodiments herein, a ground plane in the capacitor can be connected to an external ground layer by traces and/or vias. Another type of capacitor formed according to one or more embodiments herein is a three-terminal capacitor having an internal ground layer. Three-terminal capacitors can have greatly reduced inductance relative to a two-terminal capacitor and therefore can have substantially improved noise-removing performance.

Figure 1:
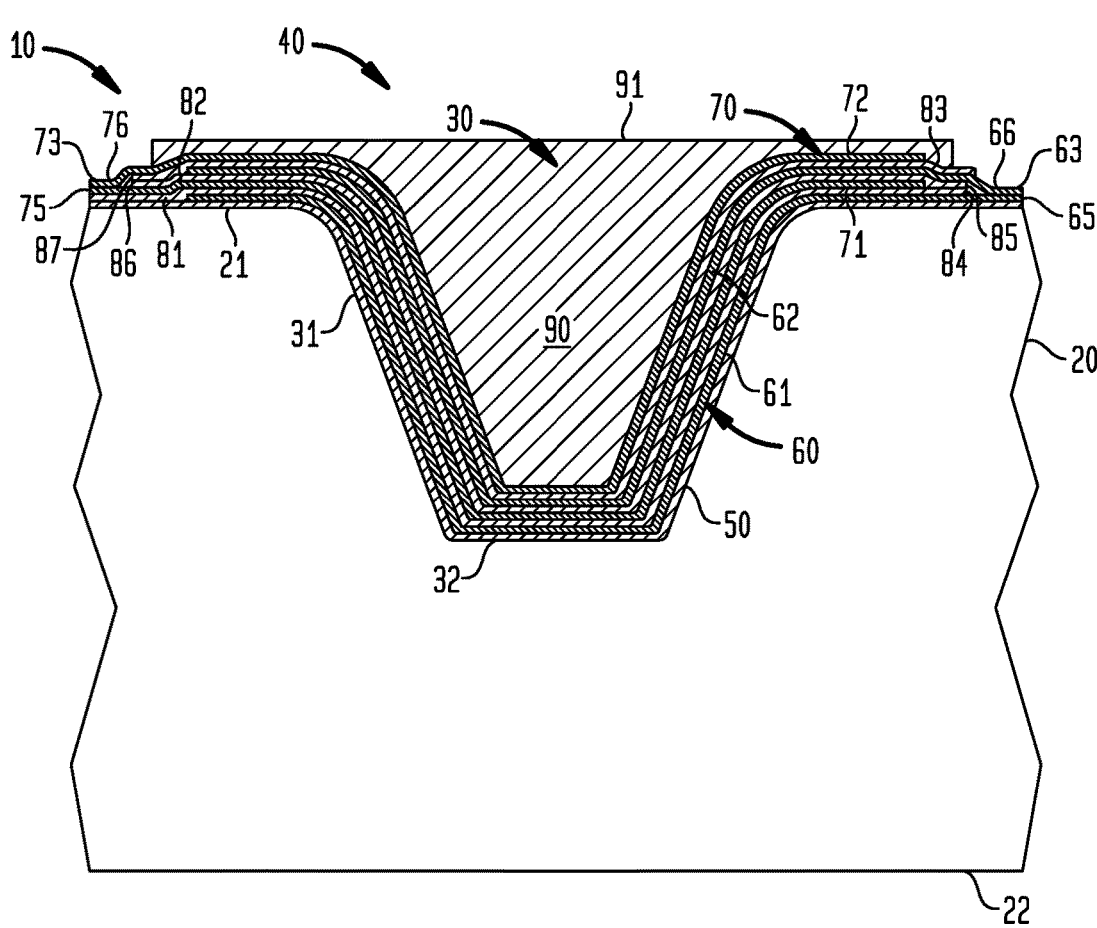
FIG. 1 is a sectional view illustrating a component in accordance with an embodiment of the invention.

With reference to FIG. 1, a component 10 according to an embodiment of the present invention includes a substrate 20 and a capacitor 40 formed in contact with the substrate. The substrate 20 has an opening 30 extending downwardly from a planar first surface 21 partially through the substrate towards a planar second surface 22 opposite the first surface. The capacitor 40 includes an insulating dielectric layer 50 overlying an inner surface 31 and a lower surface 32 of the opening 30 and a portion of the first surface 21, a first pair of electrically conductive plates 60, a second pair of electrically conductive plates 70, and a plurality of capacitor dielectric layers 80 separating each of the plates 60 and 70 from at least one adjacent plate. A dielectric region 90 overlies the plates 60 and 70 and the dielectric layers 50 and 80 at least within the opening 30.

In some embodiments, the component 10 may be a semiconductor chip, a wafer, a dielectric substrate, or the like. The substrate 20 preferably has a coefficient of thermal expansion ("CTE") less than $10*10^{-6}/°$ C. (or ppm/° C.). In a particular embodiment, the substrate 20 can have a CTE less than $7*10^{-6}/°$ C. The substrate 20 preferably consists essentially of an inorganic material such as semiconductor, glass, or ceramic. In embodiments wherein the substrate 20 is made of a semiconductor, such as silicon, a plurality of active semiconductor devices (e.g., transistors, diodes, etc.) can be disposed in an active semiconductor region thereof located at and/or below the first surface 21 or the second surface 22. The thickness of the substrate 20 between the first surface 21 and the second surface 22 typically is less than 200 μm, and can be significantly smaller, for example, 130 μm, 70 μm or even smaller.

In FIG. 1, the directions parallel to the first surface 21 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

The substrate 20 can further include a dielectric layer (not shown) overlying the first surface 21 and/or the second surface 22. Such a dielectric layer can electrically insulate conductive elements from the substrate 20. This dielectric layer can be referred to as a "passivation layer" of the substrate 20. The passivation layer can include an inorganic or organic dielectric material or both. The dielectric layer may include an electrodeposited conformal coating or other dielectric material, for example, a photoimageable polymeric material, for example, a solder mask material.

The component 10 can include one or more capacitors 40 formed in contact with the substrate 20 and exposed at the first surface 21 and/or the second surface 22 of the substrate. While not specifically shown in the figures, active semiconductor devices in the substrate 20 can be conductively connected to the capacitors 40. Each capacitor 40 can be formed at least partially within one or more openings 30.

Figure 3A:
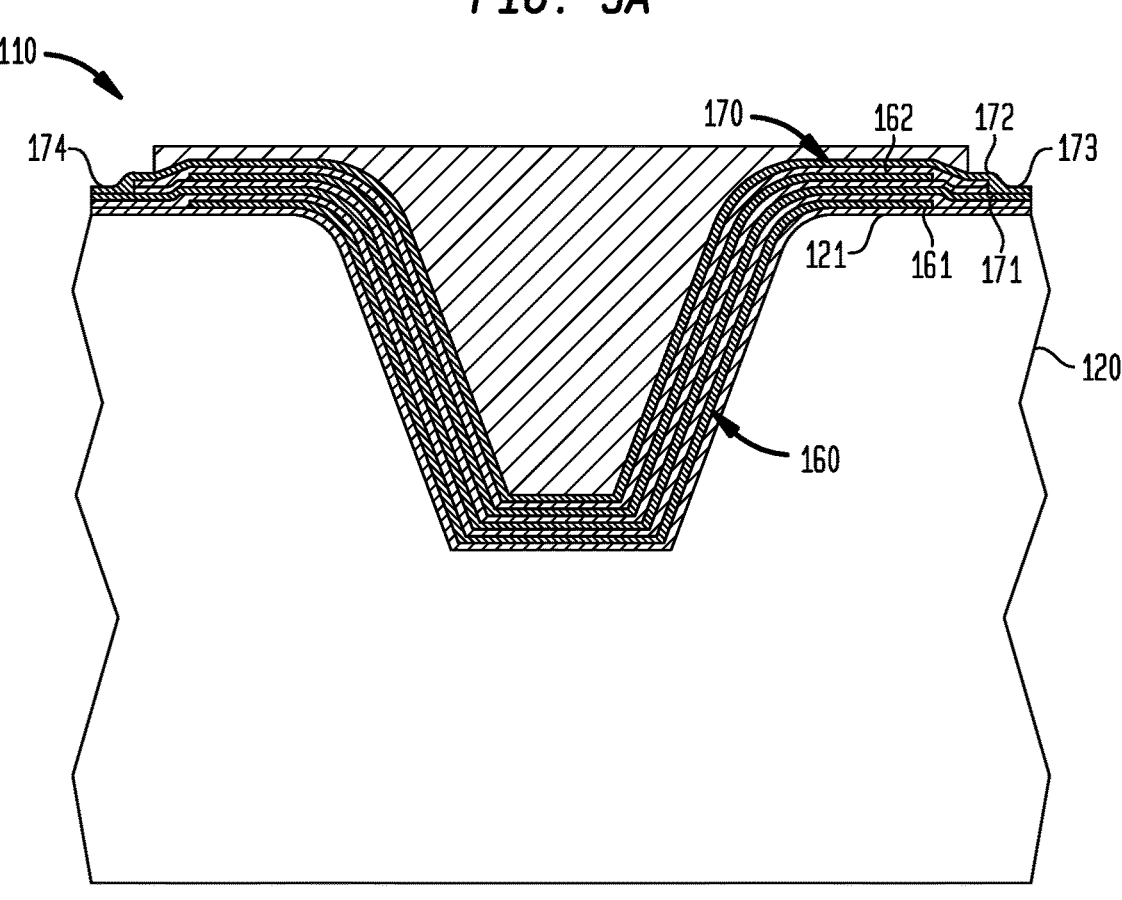
FIGS. 3A and 3B are a sectional view and a corresponding top-down plan view illustrating a component in accordance with an embodiment.
Figure 3B:
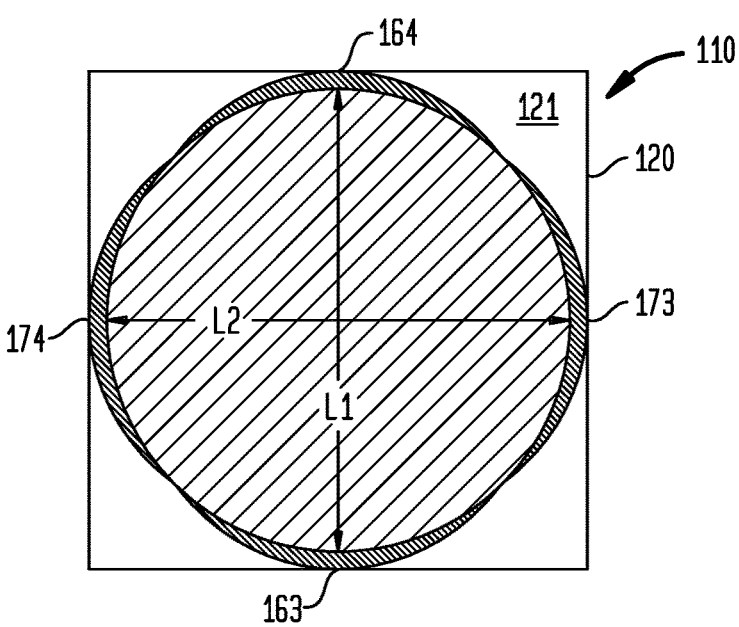
Figures 20A, 20B, 20C:
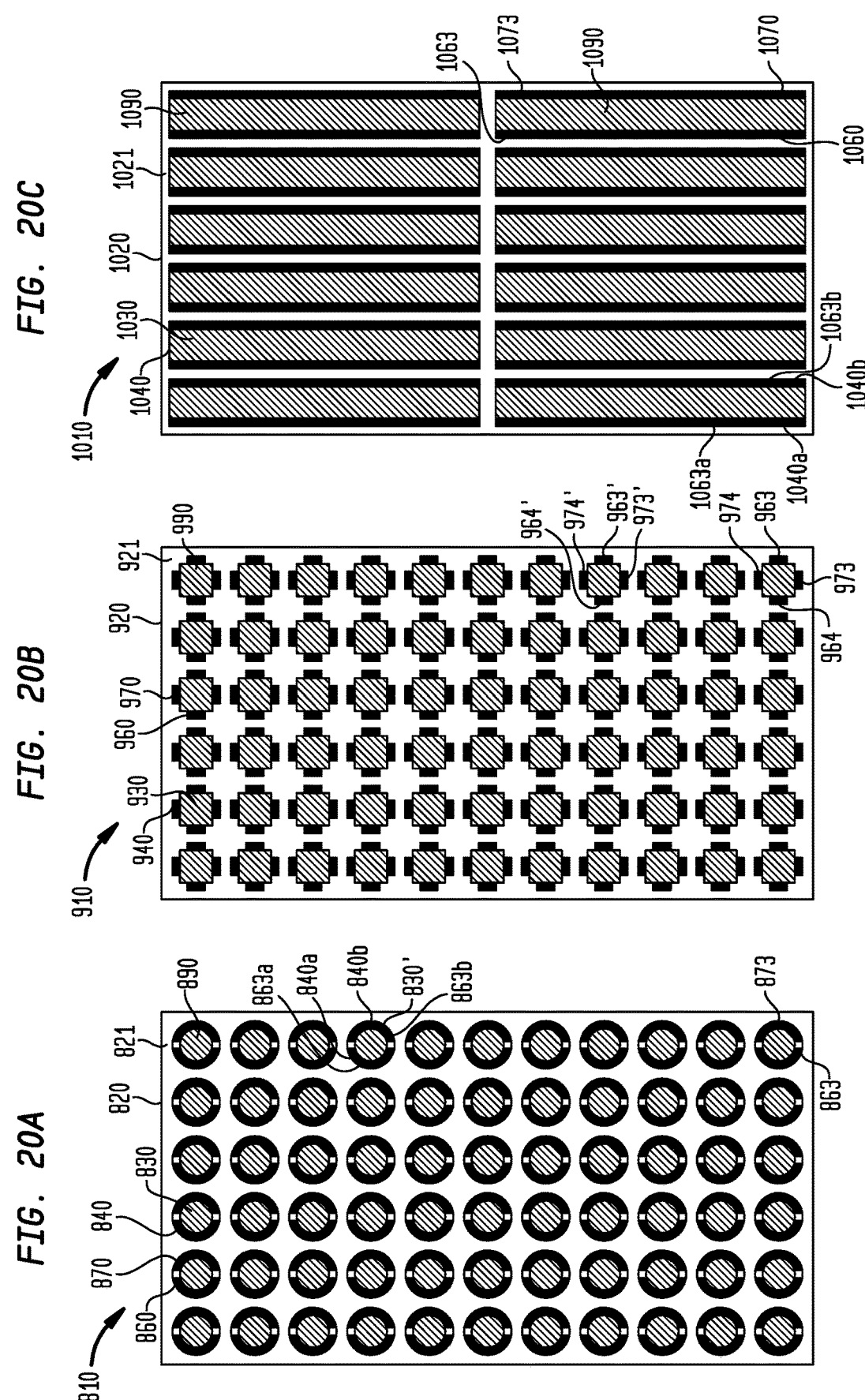
FIGS. 20A-20C are alternative top-down plan views that can correspond to the components shown in FIGS. 1, 3A, and 7A.
Figure 20D:
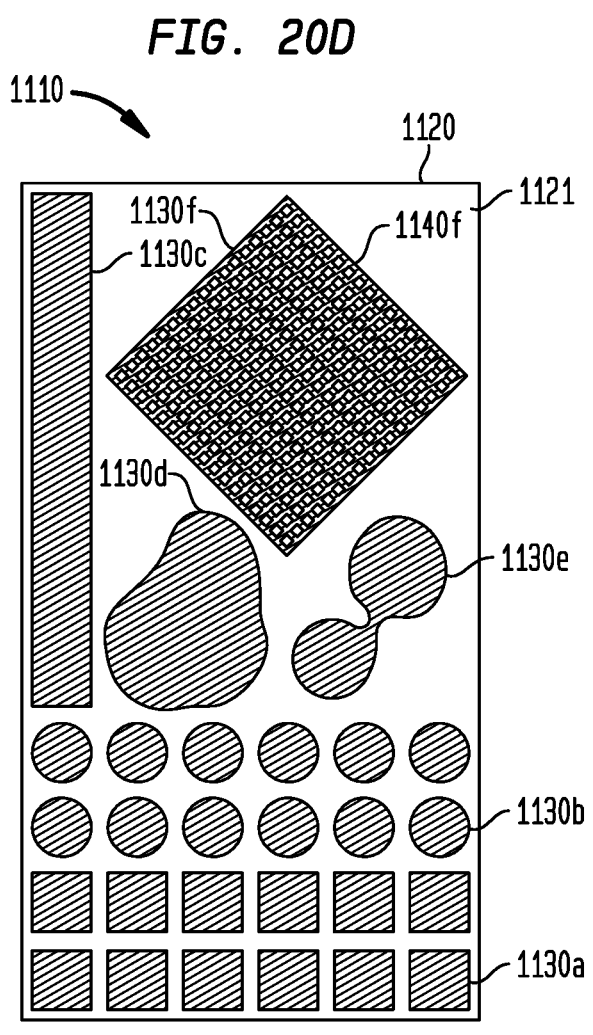
FIG. 20D is a top-down plan view that can correspond to the components shown in FIGS. 1, 3A, 7A, 11, 13, and 15.

The opening 30 can have any top-view shape, including for example, circular (as shown in FIG. 3B), oval, square, rectangular (i.e., channel-shaped, as shown in FIG. 20C), or other shapes shown in FIGS. 20A, 20B, and 20D. In some examples, the opening 30 can have any three-dimensional shape, including for example, a cylinder, a cube, a prism, or a frustoconical shape, among others.

The opening 30 extends from the first surface 21 partially through the substrate 20 towards the second surface 22. The inner surface 31 of the opening 30 can extend from the first surface 21 through the substrate 20 at any angle. Preferably, the inner surface 31 extends from the first surface 21 at an angle between 0 and 80 degrees to the horizontal plane defined by the first surface 21. The inner surface 31 can have a constant slope or a varying slope. For example, the angle or slope of the inner surface 31 relative to the horizontal plane defined by the first surface 21 can decrease in magnitude (i.e., become less positive or less negative) as the inner surface 31 penetrates further towards the second surface 22.

The insulating dielectric layer 50 overlies the inner surface 31 of the opening 30, to provide good dielectric isolation with respect to the substrate 20 and the conductive plates 60 and 70. The insulating dielectric layer 50 can include an inorganic or organic dielectric material or both. In a particular embodiment, the insulating dielectric layer 50 can include a compliant dielectric material.

The first pair of electrically conductive plates 60 includes a first plate 61 overlying the insulating dielectric layer 50 and a second plate 62 overlying the first plate and electrically connected to the first plate. The first and second plates 61 and 62 can be connected to a first electrode 63 exposed at the first surface 21 of the substrate 20, the first electrode 63 being connectable with a first electric potential.

The second pair of electrically conductive plates 70 includes a third plate 71 overlying the first plate 61 and a fourth plate 72 overlying the second plate 62 and electrically connected to the third plate. The third and fourth plates 71 and 72 can be connected to a second electrode 73 exposed at the first surface 21 of the substrate 20, the second electrode 73 being connectable with a second electric potential.

The conductive plates 60 and 70 and the electrodes 63 and 73 (and any of the other conductive elements described herein) can be made from any electrically conductive metal, including for example, copper or gold.

As used in this disclosure, a statement that an electrically conductive element is "exposed at" a surface of a substrate or a dielectric element overlying a surface of the substrate indicates that the electrically conductive element is available for contact with a theoretical point moving in a direction perpendicular to the surface of the dielectric element toward the surface of the dielectric element from outside the dielectric element. Thus, an electrode or other conductive element which is exposed at a surface of a substrate may project from such surface; may be flush with such surface; or may be recessed relative to such surface and exposed through a hole or depression in the substrate.

While essentially any technique usable for forming conductive elements can be used to form the conductive elements described herein, particular techniques as discussed in greater detail in the commonly owned U.S. patent application Ser. No. 12/842,669, filed Jul. 23, 2010, can be employed, which is hereby incorporated by reference herein. Such techniques can include, for example, selectively treating a surface with a laser or with mechanical processes such as milling or sandblasting so as to treat those portions of the surface along the path where the conductive element is to be formed differently than other portions of the surface. For example, a laser or mechanical process may be used to ablate or remove a material such as a sacrificial layer from the surface only along a particular path and thus form a groove extending along the path. A material such as a catalyst can then be deposited in the groove, and one or more metallic layers can be deposited in the groove.

Each of the electrodes 63 and 73 (and any of the other electrodes described herein) can have any top-view shape, including, for example, a circular arc shape, as shown in FIG. 3B, a circular pad shape, an oval shape, a square shape, a triangular shape, or a more complex shape, such as those shown in FIG. 20D. Each of the electrodes 63 and 73 can have any three-dimensional shape, including, for example, a frustoconical-shaped conductive post. Examples of conductive posts can be used, as shown and described in the commonly-owned U.S. patent application Ser. No. 12/832,376, filed on Jul. 8, 2010.

Connection between each of the electrodes 63 and 73 (or any of the other electrodes described herein) and components external to the component 10 can be through conductive masses (not shown). Such conductive masses can comprise a fusible metal having a relatively low melting temperature, e.g., solder, tin, or a eutectic mixture including a plurality of metals. Alternatively, such conductive masses can include a wettable metal, e.g., copper or other noble metal or non-noble metal having a melting temperature higher than that of solder or another fusible metal. Such wettable metal can be joined with a corresponding feature, e.g., a fusible metal feature of an interconnect element. In a particular embodiment, such conductive masses can include a conductive material interspersed in a medium, e.g., a conductive paste, e.g., metal-filled paste, solder-filled paste or isotropic conductive adhesive or anisotropic conductive adhesive.

The plurality of capacitor dielectric layers 80 separate each of the plates 60 and 70 from at least one adjacent plate. Each capacitor dielectric layer 80 (and all of the other capacitor dielectric layers described herein) can have a dielectric constant k of at least 3. In the embodiment shown in FIG. 1, a first capacitor dielectric layer 81 of the capacitor dielectric layers 80 overlies the first plate 61 and extends between the first plate and the third plate 71. A second capacitor dielectric layer 82 of the capacitor dielectric layers 80 overlies the third plate 71 and extends between the third plate and the second plate 62. A third capacitor dielectric layer 83 of the capacitor dielectric layers 80 overlies the second plate 62 and extends between the second plate and the fourth plate 72.

In the embodiments shown, the dielectric region 90 overlies the plates 60 and 70 and the dielectric layers 50 and 80 at least within the opening 30. The dielectric region 90 can provide good dielectric isolation with respect to the substrate 20. The dielectric region 90 can be compliant, having a sufficiently low modulus of elasticity and sufficient thickness such that the product of the modulus and the thickness provide compliancy.

In the embodiments shown, the outer surface 91 of the dielectric region 90 is located above a plane defined by the first surface 21 of the substrate 20. In other embodiments (not shown), the outer surface 91 of the dielectric region 90 can be located at the plane defined by the first surface 21 of the substrate 20, or the outer surface of the dielectric region can be recessed below the plane defined by the first surface of the substrate.

Figure 2A:
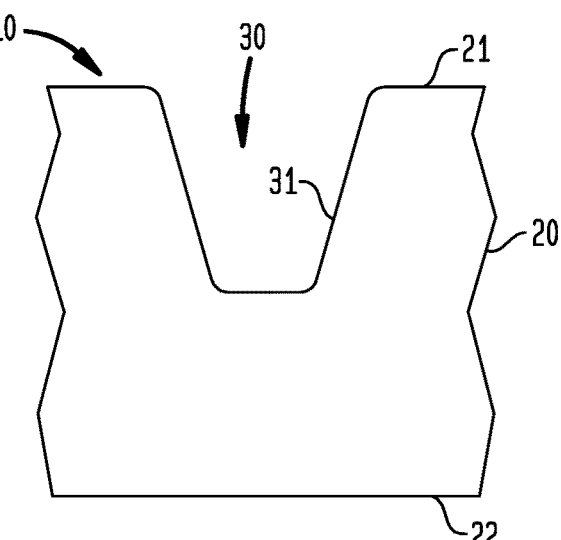
FIGS. 2A-2E are sectional views illustrating stages of fabrication in accordance with the embodiment of the invention depicted in FIG. 1.

A method of fabricating the component 10 (FIG. 1) will now be described, with reference to FIGS. 2A-2E. As illustrated in FIG. 2A, the opening 30 can be formed extending downwardly from the first surface 21 towards the second surface 22 of the substrate 20. The opening 30 can be formed for example, by selectively etching the substrate 20, after forming a mask layer where it is desired to preserve remaining portions of the first surface 21. For example, a photoimageable layer, e.g., a photoresist layer, can be deposited and patterned to cover only portions of the first surface 21, after which a timed etch process can be conducted to form the opening 30.

The inner surfaces 31 of the opening 30, extending downwardly from the first surface 21 towards the second surface 22, may be sloped, i.e., may extend at angles other a normal angle (right angle) to the exposed surface, as shown in FIG. 2A. Wet etching processes, e.g., isotropic etching processes and sawing using a tapered blade, among others, can be used to form recesses 30 having sloped inner surfaces 31. Laser ablation, mechanical milling, chemical etching, plasma etching, directing a jet of fine abrasive particles towards the substrate 20, among others, can also be used to form the recesses 30 (or any other hole or opening described herein) having sloped inner surfaces 31.

Alternatively, instead of being sloped, the inner surfaces of the opening 30 may extend in a vertical or substantially vertical direction downwardly from the first surface 21 substantially at right angles to the exposed surface. Anisotropic etching processes, laser ablation, mechanical removal processes, e.g., milling, ultrasonic machining, directing a jet of fine abrasive particles towards the substrate 20, among others, can be used to form recesses 30 having essentially vertical inner surfaces.

Figure 2B:
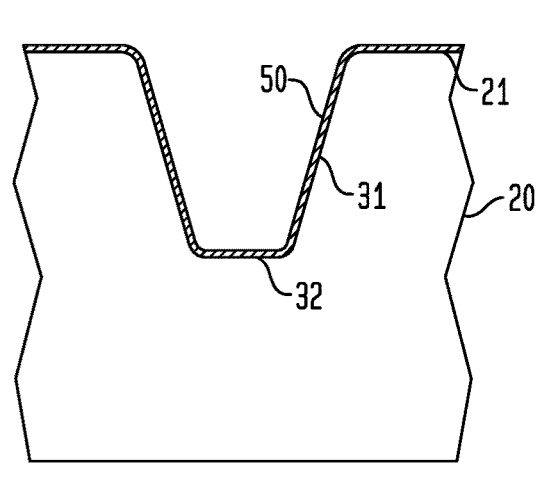

Thereafter, as illustrated in FIG. 2B, an insulating dielectric layer 50 is formed on the inner surface 31 and a lower surface 32 of the opening 30 and a portion of the first surface 21 of the substrate 20. Various methods can be used to form the dielectric layer 50. In one example, a flowable dielectric material is applied to the first surface 21 of the substrate 20, and the flowable material is then more evenly distributed across the exposed surface during a "spin-coating" operation, followed by a drying cycle which may include heating. In another example, a thermoplastic film of dielectric material can be applied to the first surface 21 after which the assembly is heated, or is heated in a vacuum environment, i.e., placed in an environment under lower than ambient pressure. In another example, vapor deposition can be used to form the insulating dielectric layer 50.

In still another example, the assembly including the substrate 20 can be immersed in a dielectric deposition bath to form a conformal dielectric coating or insulating dielectric layer 50. As used herein, a "conformal coating" is a coating of a particular material that conforms to a contour of the surface being coated, such as when the insulting dielectric layer 50 conforms to a contour of the inner surface 31 of the opening 30. An electrochemical deposition method can be used to form the conformal dielectric layer 50, including for example, electrophoretic deposition or electrolytic deposition.

In one example, an electrophoretic deposition technique can be used to form the conformal dielectric coating, such that the conformal dielectric coating is only deposited onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrodeposited conformal dielectric layer 50 on exposed surfaces of the substrate which are conductive or semiconductive, including but not limited to along the inner surface 31 of the opening 30. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition forms a continuous and uniformly thick conformal coating on conductive and/or semiconductive exterior surfaces of the assembly. In addition, the electrophoretic coating can be deposited so that it does not form on a remaining passivation layer overlying the first surface 21 of the substrate 20, due to its dielectric (nonconductive) property. Stated another way, a property of electrophoretic deposition is that is does not form on a layer of dielectric material overlying a conductor provided that the layer of dielectric material has sufficient thickness, given its dielectric properties. Typically, electrophoretic deposition will not occur on dielectric layers having thicknesses greater than about 10 microns to a few tens of microns. The conformal dielectric layer 50 can be formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| | MANUFACTURERS | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| | APPLICATION DATA | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| | FILM PROPERTIES | | |
| COLOR | Black | Black | Black |
| THICKNESS, μm | 10-35 | 10-38 | 13-36 |
| PENCIL HARDNESS | | 2H+ | 4H |
| | BATH CHARACTERISTICS | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |

TABLE 1-continued

| ECOAT NAME | ELECTROLAC | LECTRASEAL DV494 | LECTROBASE 101 |
|---|---|---|---|
| | | MANUFACTURERS | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| | | APPLICATION DATA | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| | | FILM PROPERTIES | |
| COLOR | Clear (+dyed) | Black | Black |
| THICKNESS, µm | | 10-35 | 10-35 |
| PENCIL HARDNESS | 4H | | |
| | | BATH CHARACTERISTICS | |
| SOLIDS, % wt. | 7.0 (6.5-8.0) | 10-12 | 9-11 |
| pH (25 C.) | 5.5-5.9 | 7-9 | 4.3 |
| CONDUCTIVITY (25 C.) µS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

In another example, the dielectric layer can be formed electrolytically. This process is similar to electrophoretic deposition, except that the thickness of the deposited layer is not limited by proximity to the conductive or semiconductive surface from which it is formed. In this way, an electrolytically deposited dielectric layer can be formed to a thickness that is selected based on requirements, and processing time is a factor in the thickness achieved.

Figure 2C:
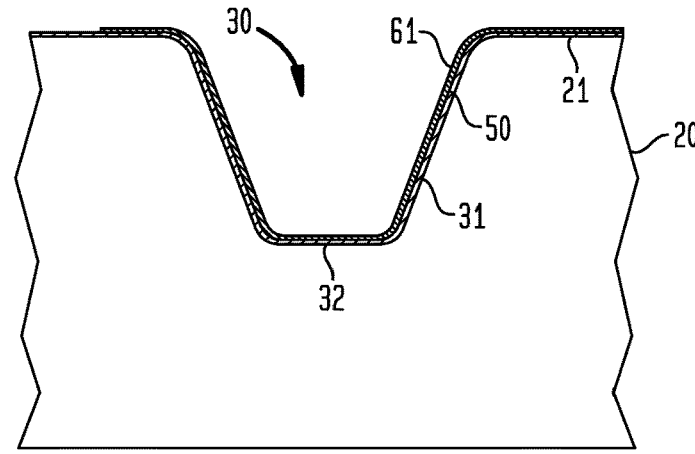

Thereafter, as illustrated in FIG. 2C, the first conductive plate 61 can be formed overlying the insulating dielectric layer 50, at least within the opening 30, such that the shape of the conductive first plate conforms to a contour of the inner surfaces 31 and the lower surface 32. To form the first plate 61 (and any of the other conductive elements described herein), an exemplary method involves depositing a metal layer by one or more of sputtering a primary metal layer onto exposed surfaces of the substrate 20 and the opening 30, plating, or mechanical deposition. Mechanical deposition can involve the directing a stream of heated metal particles at high speed onto the surface to be coated. This step can be performed by blanket deposition onto the first surface 21, the inner surface 31, and the lower surface 32, for example. In one embodiment, the primary metal layer includes or consists essentially of aluminum. In another particular embodiment, the primary metal layer includes or consists essentially of copper. In yet another embodiment, the primary metal layer includes or consists essentially of titanium. One or more other exemplary metals can be used in a process to form the first plate 61 (and any of the other conductive elements described herein). In particular examples, a stack including a plurality of metal layers can be formed on one or more of the afore-mentioned surfaces. For example, such stacked metal layers can include a layer of titanium followed by a layer of copper overlying the titanium (Ti—Cu), a layer of nickel followed by a layer of copper overlying the nickel layer (Ni—Cu), a stack of nickel-titanium-copper (Ni—Ti—Cu) provided in similar manner, or a stack of nickel-vanadium (Ni—V), for example.

Figure 2D:
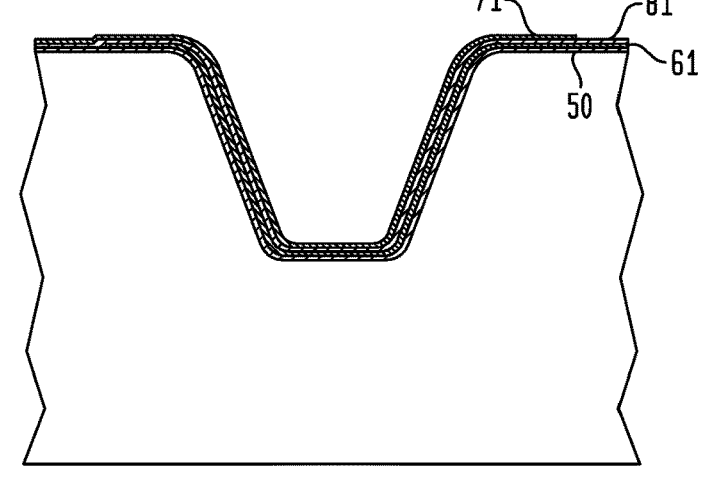

Thereafter, as illustrated in FIG. 2D, the first capacitor dielectric layer 81 can be formed overlying the first conductive plate 61, and the third conductive plate 71 can be formed overlying the first capacitor dielectric layer. The first capacitor dielectric layer 81 can be formed in a manner similar to those described above with reference to the insulating dielectric layer 50. The third conductive plate 71 can be formed in a manner similar to those described above with reference to the first conductive plate 61.

Figure 2E:
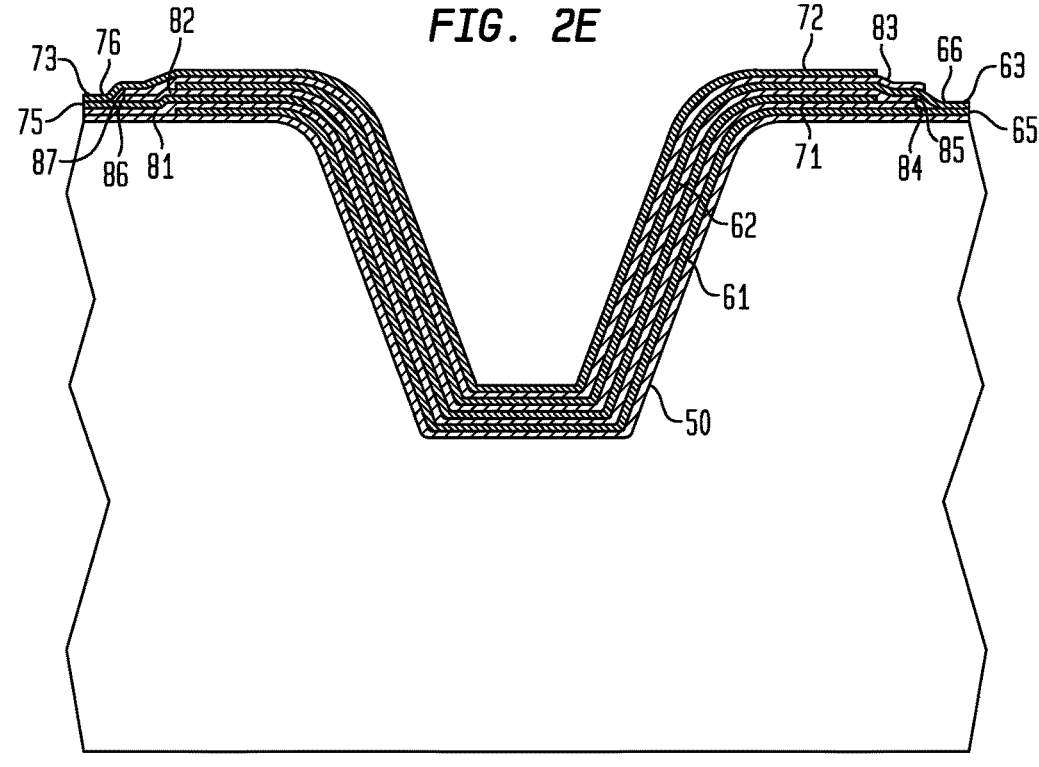

Thereafter, as illustrated in FIG. 2E, the second capacitor dielectric layer 82 can be formed overlying the third conductive plate 71, the second conductive plate 62 can be formed overlying the second capacitor dielectric layer, the third capacitor dielectric layer 83 can be formed overlying the second conductive plate, and the fourth conductive plate 72 can be formed overlying the third capacitor dielectric layer. The second and third capacitor dielectric layers 82 and 83 can be formed in a manner similar to those described above with reference to the insulating dielectric layer 50. The second and fourth conductive plates 62 and 72 can be formed in a manner similar to those described above with reference to the first conductive plate 61.

The second conductive plate 62 can be formed such that a lateral portion 66 thereof extends laterally beyond lateral edges 84 and 85 of the respective first and second capacitor dielectric layers 81 and 82, such that the lateral portion 66 contacts a lateral portion 65 of the first plate 61, thereby forming the first electrode 63. The fourth conductive plate 72 can be formed such that a lateral portion 76 thereof extends laterally beyond lateral edges 86 and 87 of the respective second and third capacitor dielectric layers 82 and 83, such that the lateral portion 76 contacts a lateral portion 75 of the third plate 71, thereby forming the second electrode 73.

Thereafter, referring again to FIG. 1, the dielectric region 90 can be formed inside the opening 30 and partially overlying the first surface 21 of the substrate 20. The dielectric region 90 can include an inorganic material, a polymeric material, or both. Optionally, the dielectric region 90 can be formed such that the exposed outer surface 91 of the region is co-planar or substantially co-planar with the first surface 21 of the substrate 20. For example, a self-planarizing dielectric material can be deposited in the opening 30, e.g., by a dispensing or stenciling process. In another example, a grinding, lapping, or polishing process can be applied to the outer surface 91 of the dielectric layer 90 after forming the dielectric region to planarize the outer surface of the dielectric region. The dielectric region 90 can be deposited such that the first and second electrodes 63 and 73 are exposed at the outer surface 91 of the dielectric region.

FIGS. 3A and 3B illustrate a variation of the component of FIGS. 1 through 2E having an alternate electrode configuration. The component 110 is similar to the component 10 described above, except that the component 110 includes four electrodes. The first and second conductive plates 161 and 162 can be connected to a first electrode 163 and a second electrode 164 exposed at the first surface 121 of the substrate 120, the first and second electrodes being connectable with a first electric potential. The first pair of plates 160 can have a long dimension L1 extending between the locations of the first and second electrodes 163 and 164. The third and fourth conductive plates 171 and 172 can be connected to a third electrode 173 and a fourth electrode 174 exposed at the first surface 121 of the substrate 120, the third and fourth electrodes being connectable with a second electric potential. The second pair of plates 170 can have a long dimension L2 extending between the locations of the third and fourth electrodes 173 and 174.

Figure 4:
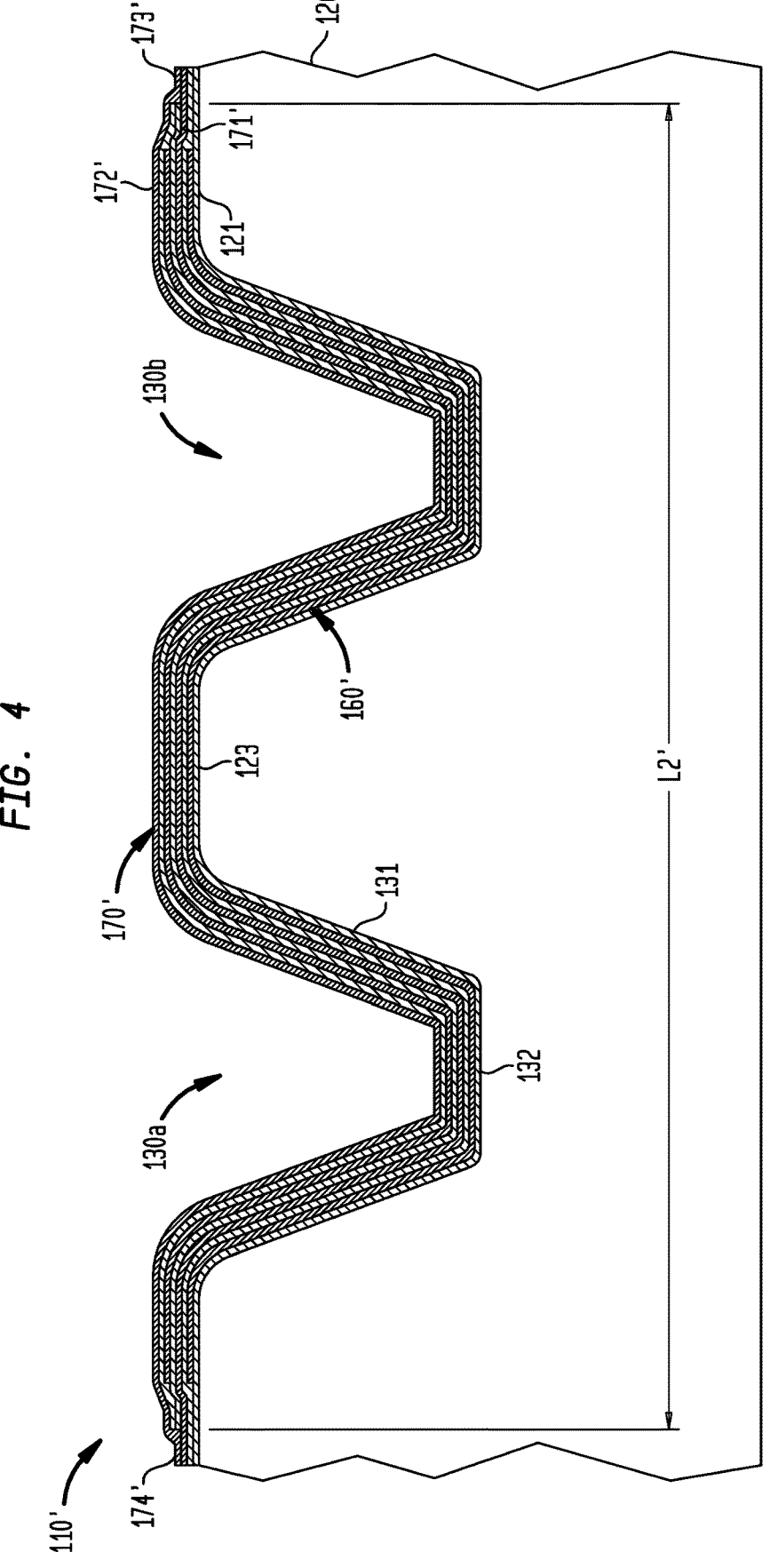
FIG. 4 is a sectional view illustrating a component in accordance with another embodiment.

FIG. 4 illustrates a variation of the component of FIGS. 3A and 3B having an alternate configuration. The component 110' is similar to the component 110 described above, except that the component 110' extends over a plurality of openings 130a and 130b (collectively referred to as openings 130). Each of the first pair of plates 160' and the second pair of plates 170' extends along the inner surfaces 131 and the lower surface 132 of each opening 130 and along portions 123 of the first surface 121 of the substrate 120 between each of the openings.

The third and fourth conductive plates 171' and 172' can be connected to a third electrode 173' and a fourth electrode 174' exposed at the first surface 121 of the substrate 120, the third and fourth electrodes being connectable with a second electric potential. The second pair of plates 170' can have a long dimension L2' extending between the locations of the third and fourth electrodes 173' and 174' across the openings 130a and 130b and across the portion 123 of the substrate 120 between the openings 130.

Similar to the component 110 shown in FIGS. 3A and 3B, the first and second electrodes may not be visible in the side cross-sectional view shown in FIG. 4, because the first pair of plates 160' can have a long dimension extending between the location of the first and second electrodes in a direction substantially perpendicular to the long dimension L2' of the second pair of plates 170'.

Figure 5A:
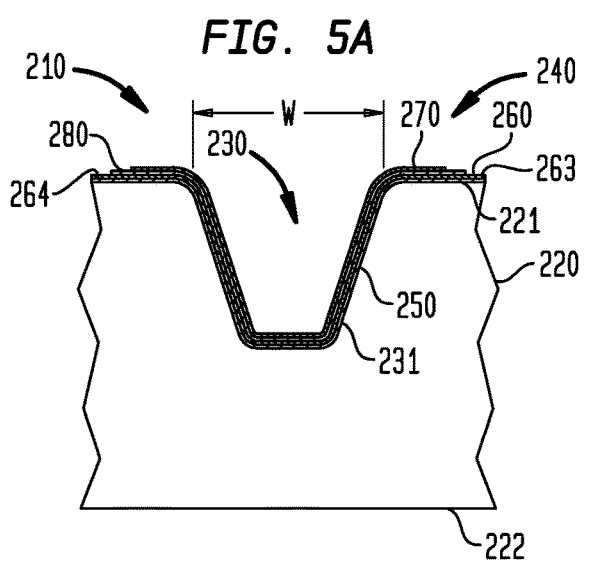
FIGS. 5A and 5B are a sectional view and a corresponding top-down plan view illustrating a component in accordance with an embodiment.
Figure 5B:
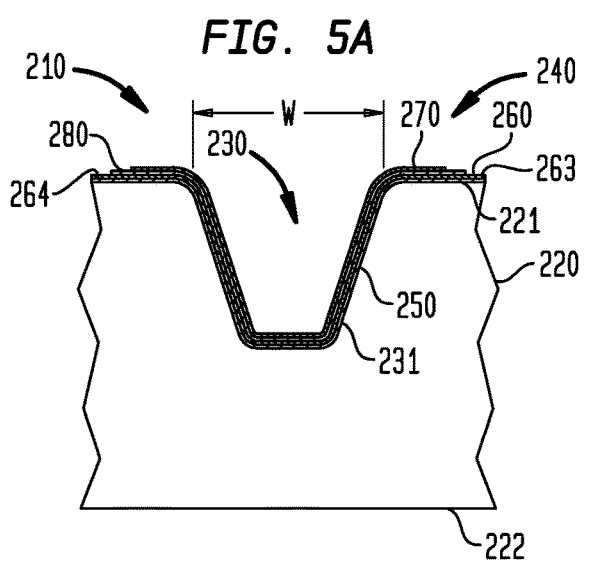

With reference to FIGS. 5A and 5B, a component 210 according to an embodiment of the present invention includes a substrate 220 and a capacitor 240 formed in contact with the substrate. The substrate 220 has an opening 230 extending downwardly from a first surface 221 partially through the substrate towards a second surface 222 opposite the first surface. The capacitor 240 includes an insulating dielectric layer 250 overlying an inner surface 231 of the opening 230, a first electrically conductive plate 260 overlying the insulating dielectric layer, a second electrically conductive plate 270, and a capacitor dielectric layer 280 separating the first and second plates from one another. A dielectric region (not shown) can optionally overlie the plates 260 and 270 and the dielectric layers 250 and 280 at least within the opening 230. The opening 230 preferably has a width W greater than 5 microns in a direction along the first surface 221 of the substrate 220.

In this embodiment, the first plate 260 can be connected to first and second electrodes 263 and 264 exposed at the first surface 221 of the substrate 220, the first and second electrodes being connectable with a first electric potential. The second plate 270 can be connected to third and fourth electrodes 273 and 274 exposed at the first surface 221 of the substrate 220, the third and fourth electrodes being connectable with a second electric potential. The first plate 260 can have a long dimension L3 extending between the locations of the first and second electrodes 263 and 264. The second plate 270 can have a long dimension L4 extending between the locations of the third and fourth electrodes 273 and 274.

Figure 5C:
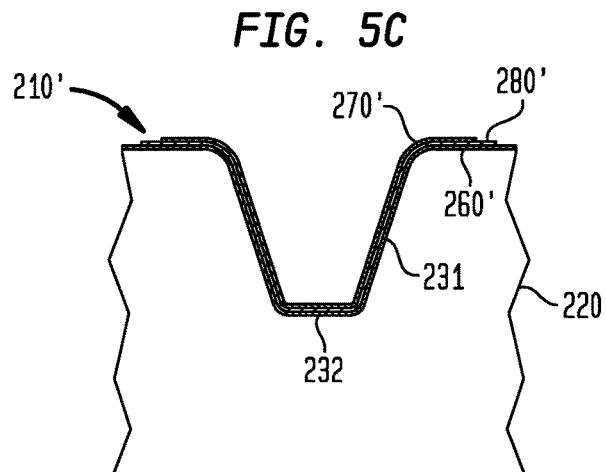
FIG. 5C is a sectional view illustrating a component in accordance with another embodiment.

FIG. 5C illustrates a variation of the component of FIGS. 5A and 5B having an alternate configuration. The component 210' is similar to the component 210 described above, except that the first plate 260' is formed in contact with the substrate 220, such that the first plate is grounded to the substrate. In the embodiment shown in FIG. 5C, there is no insulating dielectric layer extending between the first plate 260' and the inner surface 231 and the lower surface 232. The first plate 260' and the second plate 270' can be separated and insulated from each other by a capacitor dielectric layer 280'.

Figure 6A:
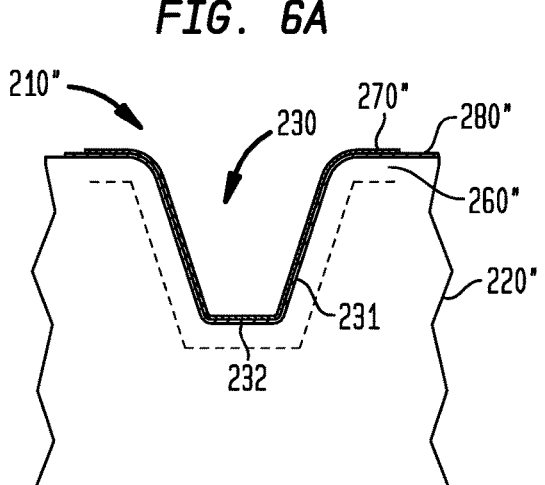
FIGS. 6A and 6B are a sectional view and a corresponding top-down plan view illustrating a component in accordance with an embodiment.
Figure 6B:
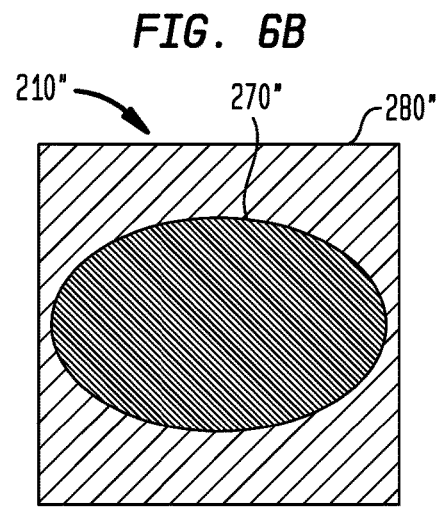

FIGS. 6A and 6B illustrates a variation of the component of FIG. 5C having an alternate configuration. The component 210" is similar to the component 210' described above, except that the first plate 260" is a conductive portion of the substrate 220" extending inward from the inner surface 231 and/or the lower surface 232 of the opening 230. In the embodiment shown in FIGS. 6A and 6B, the first plate 260" can be formed by doping a portion of the substrate 220" adjacent to the inner surface 231 and/or the lower surface 232 of the opening 230. In a particular example, a substrate 220" made from a semiconductor such as silicon can be doped with boron or arsenic, for example, to create the conductive first plate 260". The first plate 260" and the second plate 270" can be separated and insulated from each other by a capacitor dielectric layer 280".

Figure 7A:
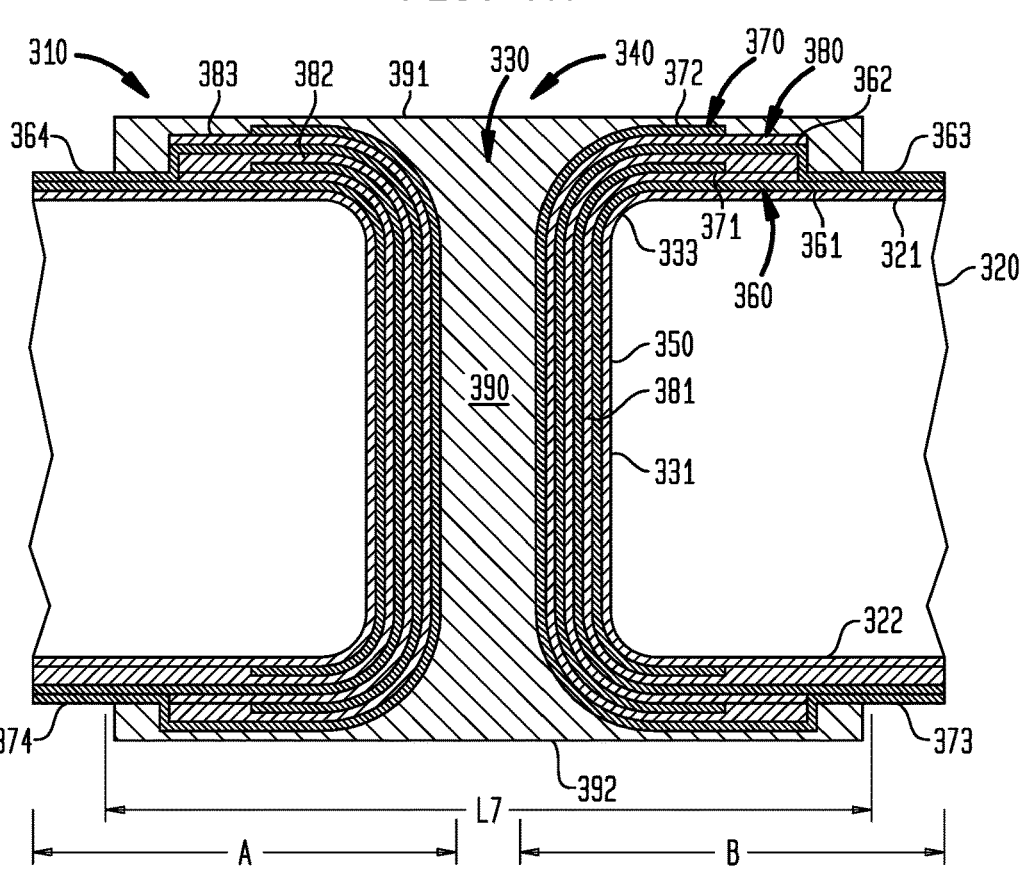
FIGS. 7A and 7B are a sectional view and a corresponding top-down plan view illustrating a component in accordance with an embodiment.

With reference to FIG. 7A, a component 310 according to an embodiment of the present invention includes a substrate 320 and a capacitor 340 formed in contact with the substrate. The substrate 320 has a through opening 330 extending through the substrate between a planar first surface 321 and a planar second surface 322 opposite the first surface. The capacitor 340 includes an insulating dielectric layer 350 overlying an inner surface 331 of the opening 330 and portions of the first and second surfaces 321 and 322, a first pair of electrically conductive plates 360, a second pair of electrically conductive plates 370, and a plurality of capacitor dielectric layers 380 separating each of the plates 360 and 370 from at least one adjacent plate. A dielectric region 390 overlies the plates 360 and 370 and the dielectric layers 350 and 380 at least within the opening 330.

The substrate 320 is similar to the substrate 20 disclosed above with reference to FIGS. 1 through 2E. The component 310 can include one or more capacitors 340 formed in contact with the substrate 320 and exposed at the first surface 321 and/or the second surface 322 of the substrate. While not specifically shown in the figures, active semiconductor devices in the substrate 320 can be conductively connected to the capacitors 340. Each capacitor 340 can be formed at least partially within one or more through openings 330.

Figure 7B:
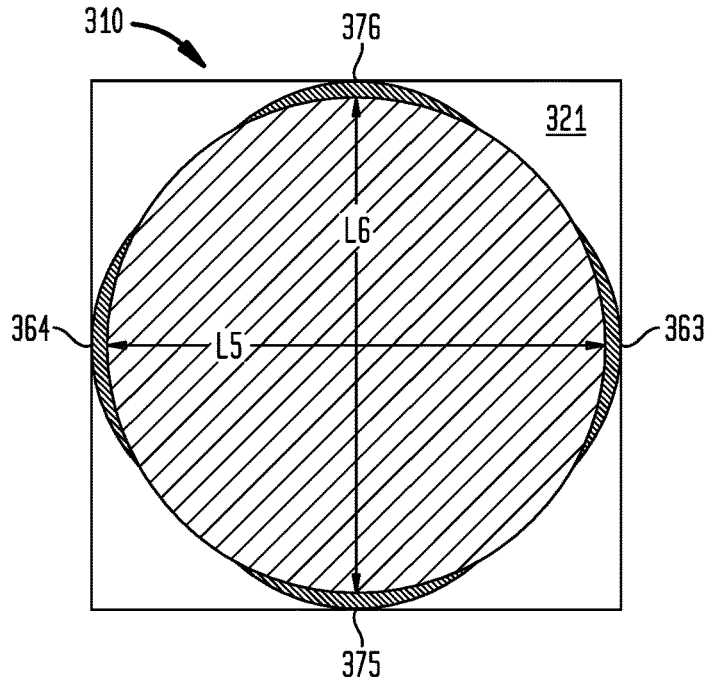

The through opening 330 can have any top-view shape, including for example, circular (as shown in FIG. 7B), oval, square, rectangular (i.e., channel-shaped, as shown in FIG. 20C), or other shapes shown in FIGS. 20A, 20B, and 20D. In some examples, the through opening 330 can have any three-dimensional shape, including for example, a cylinder, a cube, a prism, or a frustoconical shape, among others.

The inner surface 331 of the through opening 330 can extend from the first surface 321 through the substrate 320 at any angle. Preferably, the inner surface 331 extends from the first surface 321 at approximately 90 degrees to the horizontal plane defined by the first surface. The through opening 330 has rounded edges 333 where the inner surface 331 meets the first and second surfaces 321 and 322, although in other embodiments, the edges 333 can alternatively be chamfered or substantially right-angled. The inner surface 331 can have a constant slope or a varying slope. For example, the angle or slope of the inner surface 331 relative to the horizontal plane defined by the first surface 321 can decrease in magnitude (i.e., become less positive or less negative) as the inner surface 331 penetrates further towards the second surface 322.

Similar to the insulating dielectric layer 50 shown in FIG. 1, the insulating dielectric layer 350 overlies the inner surface 331 of the through opening 330 and portions of the first and second surfaces 321 and 322, to provide good dielectric isolation with respect to the substrate 320 and the conductive plates 360 and 370.

The first pair of electrically conductive plates 360 includes a first plate 361 overlying the insulating dielectric layer 350 and a second plate 362 overlying the first plate and electrically connected to the first plate. The first and second plates 361 and 362 can each be connected to first and second electrodes 363 and 364 exposed at the first surface 321 of the substrate 320, the first and second electrodes being connectable with a first electric potential.

The second pair of electrically conductive plates 370 includes a third plate 371 overlying the first plate 361 and a fourth plate 372 overlying the second plate 362 and electrically connected to the third plate. The third and fourth plates 371 and 372 can each be connected to third and fourth electrodes 373 and 374 exposed at the second surface 322 of the substrate 320, the third and fourth electrodes being connectable with a second electric potential.

The plurality of capacitor dielectric layers 380 separate each of the plates 360 and 370 from at least one adjacent plate. In the embodiment shown in FIG. 7A, a first capacitor dielectric layer 381 of the capacitor dielectric layers 380 overlies the first plate 361 and extends between the first plate and the third plate 371. A second capacitor dielectric layer 382 of the capacitor dielectric layers 380 overlies the third plate 371 and extends between the third plate and the second plate 362. A third capacitor dielectric layer 383 of the capacitor dielectric layers 380 overlies the second plate 362 and extends between the second plate and the fourth plate 372.

Similar to the dielectric region 90 shown in FIG. 1, the dielectric region 390 overlies the plates 360 and 370 and the dielectric layers 350 and 380 at least within the through opening 330. The dielectric region 390 can provide good dielectric isolation with respect to the substrate 320.

As shown in FIG. 7A, a first outer surface 391 of the dielectric region 390 is located above a plane defined by the first surface 321 of the substrate 320, and a second outer surface 392 of the dielectric region is located above a plane defined by the second surface 322 of the substrate 320. In other embodiments (not shown), the outer surfaces 391 and 392 of the dielectric region 390 can be located at the respective planes defined by the first and second surfaces 321 and 322 of the substrate 320, or the outer surfaces of the dielectric region can be recessed below the planes defined by the first and second surfaces of the substrate.

As shown in FIG. 7A, the capacitor 340 can have first and second electrodes 363 and 364 exposed at the first surface 321 and connected to the first pair of plates 360, the first and second electrodes being connectable with a first electric potential, and third and fourth electrodes 373 and 374 exposed at the second surface 322 and connected to the second pair of plates 370, the third and fourth electrodes being connectable with a second electric potential.

In a particular embodiment, shown in FIG. 7B, the capacitor 340 can further include fifth and sixth electrodes 375 and 376 exposed at the first surface 321 and connected to the second pair of plates 370, the fifth and sixth electrodes being connectable with the second electric potential, such that the second pair of plates is connected to a separate pair of electrodes exposed at each of the first and second surfaces 321 and 322. The capacitor 340 can further include seventh and eighth electrodes (not shown) exposed at the second surface 322 and connected to the first pair of plates 360 (in a similar configuration as that shown in FIG. 7B), the seventh and eighth electrodes being connectable with the first electric potential, such that the first pair of plates can be connected to a separate pair of electrodes exposed at each of the first and second surfaces 321 and 322.

At the first surface 321, the first pair of plates 360 can have a long dimension L5 extending along the first surface between the locations of the first and second electrodes 363 and 364, and the second pair of plates 370 can have a long dimension L6 extending along the first surface between the locations of the fifth and sixth electrodes 375 and 376, the long dimensions L5 and L6 being approximately perpendicular to one another. At the second surface 322, the second pair of plates 370 can have a long dimension L7 extending along the second surface between the locations of the third and fourth electrodes 373 and 374, and the first pair of plates 360 can have a long dimension (not shown, but similar to the long dimension L6 shown in FIG. 7B) extending along the second surface between the locations of the seventh and eighth electrodes and being approximately perpendicular to the long dimension L7.

As shown in FIGS. 7A and 7B, the component 310 includes a single capacitor 340 formed in contact with the substrate 320 through the through opening 330, whereby the first and second pairs of plates 360 and 370 extend around the inner surface 331 of the through the opening. For example, the first and second pairs of plates 360 and 370 can have an annular shape extending around an opening 330 having a circular or oval cross-sectional shape.

In a particular embodiment, the component 310 can include first and second independent capacitors 340, each capacitor comprising a respective region A or B of the component with the insulating dielectric region 390 extending therebetween. In such a component having two independent capacitors, the plates 360 and 370 of the first capacitor can be separated from the plates 360 and 370 of the second capacitor by an insulated gap extending between the two capacitors. For example, such a two-capacitor component can have a top view according to one of FIGS. 20A-20C, in which there is a gap (the exact location of the gap is not visible in FIG. 7A) between first and second capacitors located at opposite sides of the opening.

Figures 8A, 8B, 8C, 8D:
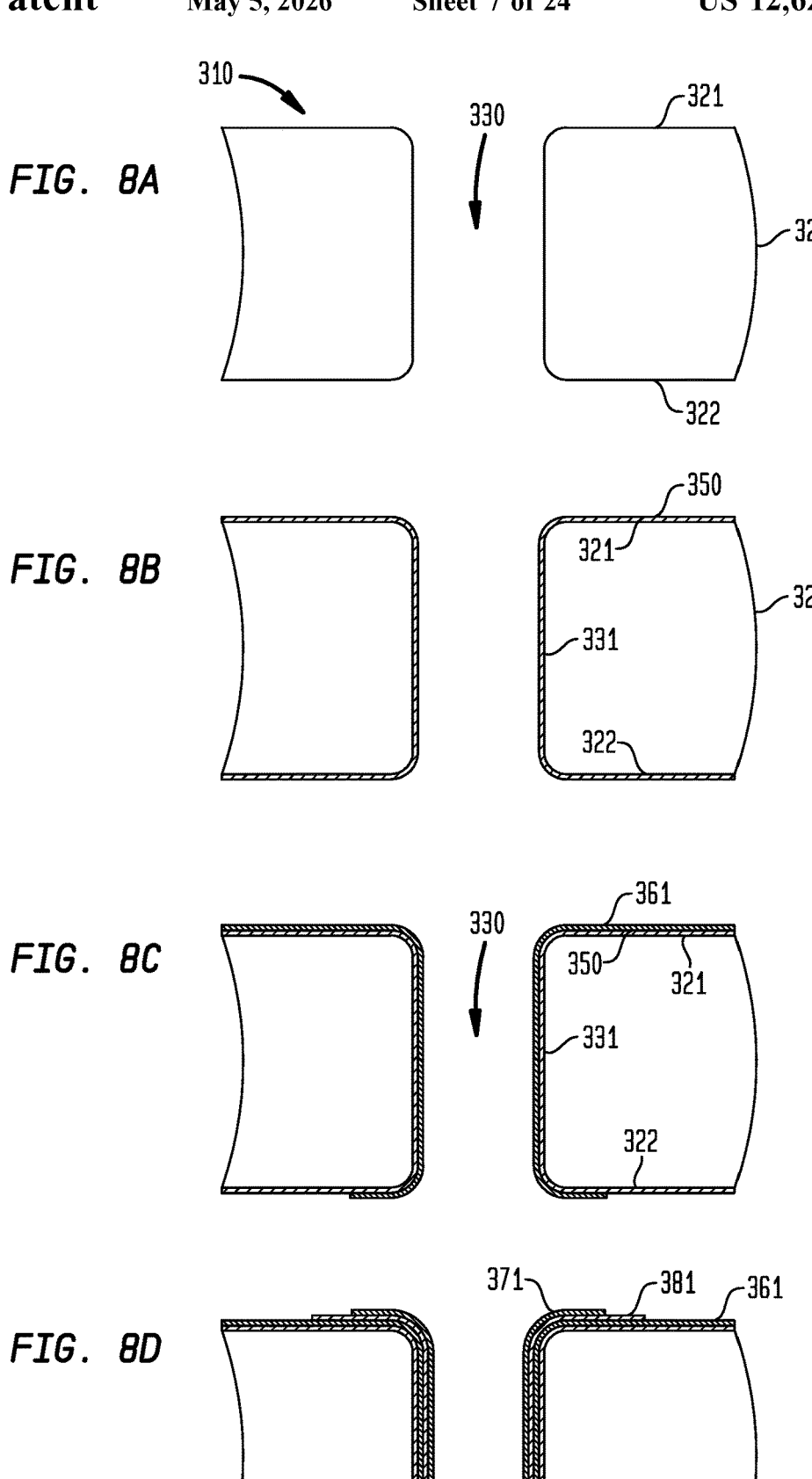
FIGS. 8A-8F are sectional views illustrating stages of fabrication in accordance with the embodiment of the invention depicted in FIGS. 7A and 7B.

A method of fabricating the component 310 (FIGS. 7A and 7B) will now be described, with reference to FIGS. 8A-8F. As illustrated in FIG. 8A, the through opening 330 can be formed extending through the thickness of the substrate 320 from the first surface 321 towards the second surface 322 of from the second surface towards the first surface. The through opening 330 can be formed using similar methods as those described above with respect to FIG. 2A.

Thereafter, as illustrated in FIG. 8B, an insulating dielectric layer 350 is formed on the inner surface 331 of the through opening 330 and on portions of the first surface 321 and the second surface 322 of the substrate 320. The insulating dielectric layer 350 can be formed using similar methods as those described above with respect to FIG. 2B.

Thereafter, as illustrated in FIG. 8C, the first conductive plate 361 can be formed overlying the insulating dielectric layer 350, at least within the through opening 330, such that a contour of the conductive first plate conforms to contours of the inner surface 331 and portions of the first and second surfaces 321 and 322. The first plate 361 can be formed using similar methods as those described above with respect to FIG. 2C.

Figure 8E:
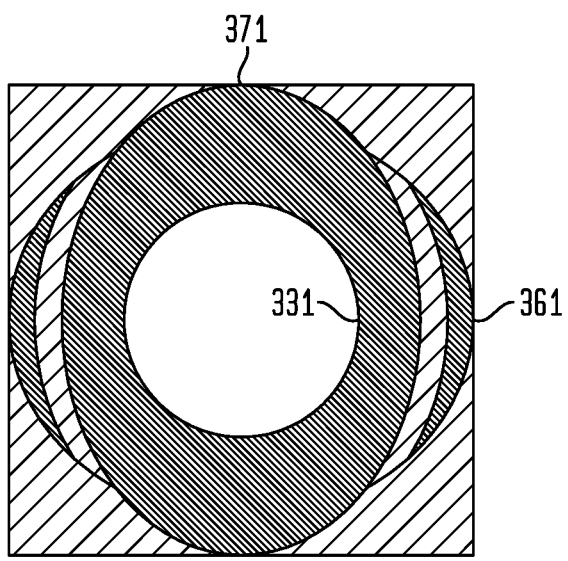

Thereafter, as illustrated in FIG. 8D, the first capacitor dielectric layer 381 can be formed overlying the first conductive plate 361, and the third conductive plate 371 can be formed overlying the first capacitor dielectric layer. The first capacitor dielectric layer 381 can be formed using similar methods as described above with reference to the insulating dielectric layer 50 (FIG. 2B). The third conductive plate 371 can be formed using similar methods as those described above with reference to the first conductive plate 61 (FIG. 2C). As can be seen in FIG. 8E (one possible top-view embodiment corresponding to FIG. 8D), the first and third plates 361 and 371 can be formed having an annular shape extending about an inner surface 331 having a circular cross-section.

Figure 8F:
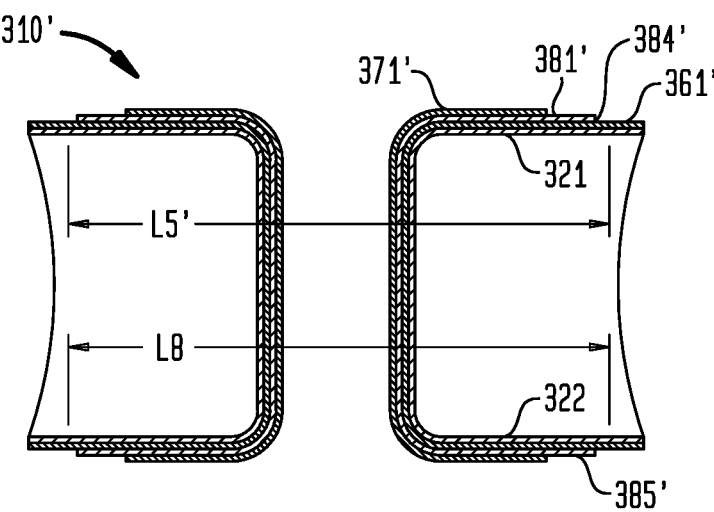

FIG. 8F illustrates a variation of the partially-formed component of FIG. 8D having an alternate capacitor configuration at the second surface 322. In the cross-sectional view of component 310' visible in FIG. 8E, the first conductive plate 361' extends beyond lateral edges 384' and 385' of the first capacitor dielectric layer 381' overlying the respective first and second surfaces 321 and 322. The third conductive plate 371' does not extend beyond the lateral edges 384' and 385', such that a long dimension L5' of the first plate 361' extending along the first surface 321 can be located in approximately the same vertical plane as a long dimension L8 of the first plate extending along the second surface 322. In such an embodiment, the first, second, seventh, and eighth electrodes connected to the first pair of plates can be located in the same vertical plane.

Thereafter, referring again to FIG. 7A, the second capacitor dielectric layer 382 can be formed overlying the third conductive plate 371, the second conductive plate 362 can be formed overlying the second capacitor dielectric layer, the third capacitor dielectric layer 383 can be formed overlying the second conductive plate, and the fourth conductive plate 372 can be formed overlying the third capacitor dielectric layer. The second and third capacitor dielectric layers 382 and 383 can be formed using similar methods as described above with reference to the insulating dielectric layer 50 (FIG. 2B). The second and fourth conductive plates 362 and 372 can be formed using similar methods as those described above with reference to the first conductive plate 61 (FIG. 2C).

Thereafter, the dielectric region 390 can be formed inside the through opening 330 and partially overlying the first and second surfaces 321 and 322. The dielectric region 390 can include an inorganic material, a polymeric material, or both. The dielectric region 390 can be formed using similar methods as described above with reference to the dielectric region 90 (FIG. 1). The dielectric region 390 can be deposited such that the first, second, fifth, and sixth electrodes 363, 364, 375, and 376 are exposed at the first outer surface 391 of the dielectric region and the third and fourth electrodes 373 and 374 and the seventh and eighth electrodes (not shown in FIGS. 7A and 7B) are exposed at the second outer surface 392.

Figure 9:
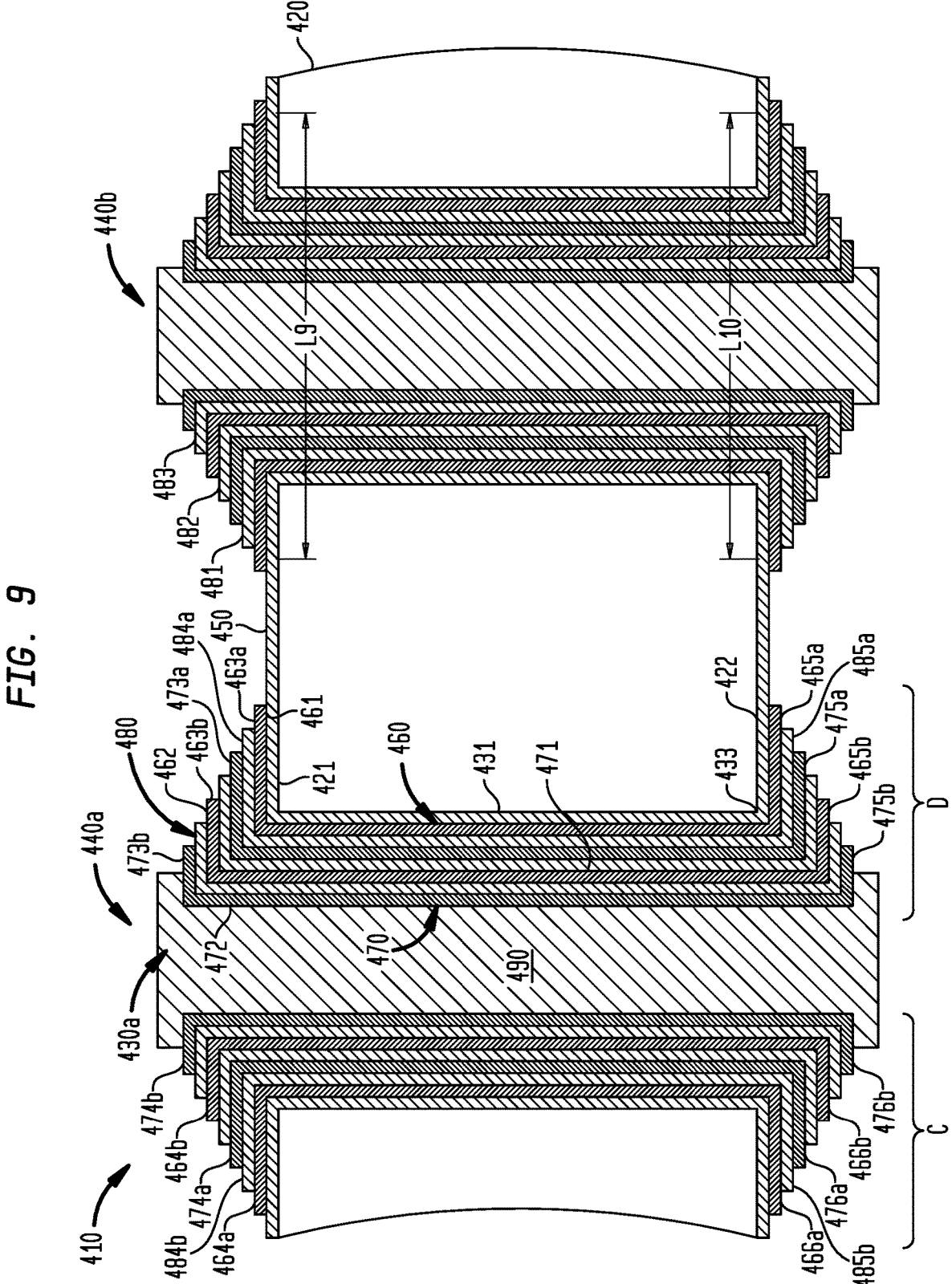
FIG. 9 is a sectional view illustrating a component in accordance with another embodiment.

With reference to FIG. 9, a component 410 according to an embodiment of the present invention includes a substrate 420 and capacitors 440a and 440b (collectively capacitors 440) formed in contact with the substrate. The substrate 420 has through openings 430a and 430b (collectively through openings 430) extending through the substrate between a planar first surface 421 and a planar second surface 422 opposite the first surface. Each capacitor 440 includes an insulating dielectric layer 450 overlying an inner surface 431 of the corresponding opening 430 and portions of the first and second surfaces 421 and 422, a first pair of electrically conductive plates 460, a second pair of electrically conductive plates 470, and a plurality of capacitor dielectric layers 480 separating each of the plates 460 and 470 from at least one adjacent plate. A dielectric region 490 overlies the plates 460 and 470 and the dielectric layers 450 and 480 at least within each corresponding opening 430.

The substrate 420 is similar to the substrate 20 disclosed above with reference to FIGS. 1 through 2E. Each through opening 430 is similar to the through opening 330 disclosed above with reference to FIGS. 7A through 8F. The inner surface 431 of each respective through opening 430 can extend from the first surface 421 through the substrate 420 at any angle. Preferably, the inner surface 431 extends from the first surface 421 at approximately 90 degrees to the horizontal plane defined by the first surface. The through opening 430 has substantially right-angled edges 433 where the inner surface 431 meets the first and second surfaces 421 and 422, although in other embodiments, the edges 433 can alternatively be chamfered or rounded. The inner surface 431 can have a constant slope or a varying slope. For example, the angle or slope of the inner surface 431 relative to the horizontal plane defined by the first surface 421 can decrease in magnitude (i.e., become less positive or less negative) as the inner surface 431 penetrates further towards the second surface 422.

Similar to the insulating dielectric layer 50 shown in FIG. 1, each insulating dielectric layer 450 overlies the inner surface 431 of the respective through opening 430 and portions of the first and second surfaces 421 and 422, to provide good dielectric isolation with respect to the substrate 420 and the conductive plates 460 and 470.

The first pair of electrically conductive plates 460 includes a first plate 461 overlying the insulating dielectric layer 450 and a second plate 462 overlying the first plate. At the first surface 421 of the substrate 420, the first plate 461 can be connected to first and second electrodes 463a and 464a exposed at the first surface, the first and second electrodes being connectable with a first electric potential. The second plate 462 can be connected to third and fourth electrodes 463b and 464b exposed at the first surface 421 and connectable with the first electric potential. At the second surface 422 of the substrate 420, the first plate 461 can also be connected to fifth and sixth electrodes 465*a* and 466*a* exposed at the second surface, the fifth and sixth electrodes being connectable with the first electric potential. The second plate 462 can also be connected to seventh and eighth electrodes 465*b* and 466*b* exposed at the second surface 422 and connectable with the first electric potential.

Although not shown in FIG. 9, the first pair of electrically conductive plates 460 can be electrically connected to one another, for example, by having the first and third electrodes 463*a* and 463*b* joined to become a single electrode, and/or by having the second and fourth electrodes 464*a* and 464*b* joined to become a single electrode, and/or by having the fifth and seventh electrodes 465*a* and 465*b* joined to become a single electrode, and/or by having the sixth and eighth electrodes 466*a* and 466*b* joined to become a single electrode.

The second pair of electrically conductive plates 470 includes a third plate 471 overlying the first plate 461 and a fourth plate 472 overlying the second plate 462. At the first surface 421 of the substrate 420, the third plate 471 can be connected to ninth and tenth electrodes 473*a* and 474*a* exposed at the first surface, the ninth and tenth electrodes being connectable with a second electric potential. The fourth plate 472 can be connected to eleventh and twelfth electrodes 473*b* and 474*b* exposed at the first surface 421 and connectable with the second electric potential. At the second surface 422 of the substrate 420, the third plate 471 can also be connected to thirteenth and fourteenth electrodes 475*a* and 476*a* exposed at the second surface, the thirteenth and fourteenth electrodes being connectable with the second electric potential. The fourth plate 472 can also be connected to fifteenth and sixteenth electrodes 475*b* and 476*b* exposed at the second surface 422 and connectable with the second electric potential.

Although not shown in FIG. 9, the second pair of electrically conductive plates 470 can be electrically connected to one another, for example, by having the ninth and eleventh electrodes 473*a* and 473*b* joined to become a single electrode, and/or by having the tenth and twelfth electrodes 474*a* and 474*b* joined to become a single electrode, and/or by having the thirteenth and fifteenth electrodes 475*a* and 475*b* joined to become a single electrode, and/or by having the fourteenth and sixteenth electrodes 476*a* and 476*b* joined to become a single electrode.

The plurality of capacitor dielectric layers 480 separate each of the plates 460 and 470 from at least one adjacent plate. A first capacitor dielectric layer 481 of the capacitor dielectric layers 480 overlies the first plate 461 and extends between the first plate and the third plate 471. A second capacitor dielectric layer 482 of the capacitor dielectric layers 480 overlies the third plate 471 and extends between the third plate and the second plate 462. A third capacitor dielectric layer 483 of the capacitor dielectric layers 480 overlies the second plate 462 and extends between the second plate and the fourth plate 472.

Similar to the dielectric region 90 shown in FIG. 1, each dielectric region 490 overlies the plates 460 and 470 and the dielectric layers 450 and 480 at least within the respective through opening 430. Each dielectric region 490 can provide good dielectric isolation with respect to the substrate 420.

Similar to the component 310' shown in FIG. 8E, the first conductive plate 461 extends beyond lateral edges 484*a* and 484*b* of the first capacitor dielectric layer 481 overlying the first surface 421, and the first conductive plate extends beyond lateral edges 485*a* and 485*b* of the first capacitor dielectric layer overlying the second surface 422. The third conductive plate 471 does not extend beyond the lateral edges 484*a*, 484*b*, 485*a*, and 485*b*, such that a long dimension L9 of the first plate 461 extending along the first surface 421 can be located in approximately the same vertical plane as a long dimension L10 of the first plate extending along the second surface 422. Similarly, each of the second, third, and fourth conductive plates 462, 471, and 472 extends beyond respective lateral edges of the corresponding overlying dielectric layer 482 or 483 or the overlying dielectric region 490, such that long dimensions of each plate extending along the first and second surfaces can be located in approximately the same vertical plane. In such an embodiment, the first through eighth electrodes 463*a* through 466*b* connected to the first pair of plates and/or the ninth through sixteenth electrodes 473*a* through 476*b* connected to the second pair of plates can be located in the same vertical plane. Alternatively, any or each of the first through sixteenth electrodes 463*a* through 466*b* and 473*a* through 476*b* can be located in individual vertical planes relative to any of the other of the first though sixteenth electrodes.

As shown in FIG. 9, the component 410 includes one capacitor 440*a* and one capacitor 440*b* formed in contact with the substrate 420 through each corresponding through opening 430*a* and 430*b*, whereby the first and second pairs of plates 460 and 470 of each capacitor extend around the inner surface 431 of the corresponding through opening. For example, the first and second pairs of plates 460 and 470 can have an annular shape extending around an opening 430 having a circular or oval cross-sectional shape.

In a particular embodiment, the component 410 can include first and second independent capacitors 440*a* extending through a single through opening 430*a*, each capacitor comprising a respective region C or D of the component with the insulating dielectric region 490 extending therebetween. In such a component having two independent capacitors extending through a single through opening 430*a*, the plates 460 and 470 of the first capacitor can be separated from the plates 460 and 470 of the second capacitor by an insulated gap extending between the two capacitors. For example, such a two-capacitor component can have a top view according to one of FIGS. 20A-20C, in which there is a gap (the exact location of the gap is not visible in FIG. 9) between first and second capacitors located at opposite sides of the opening 330*a*.

Figures 10A, 10B, 10C, 10D:
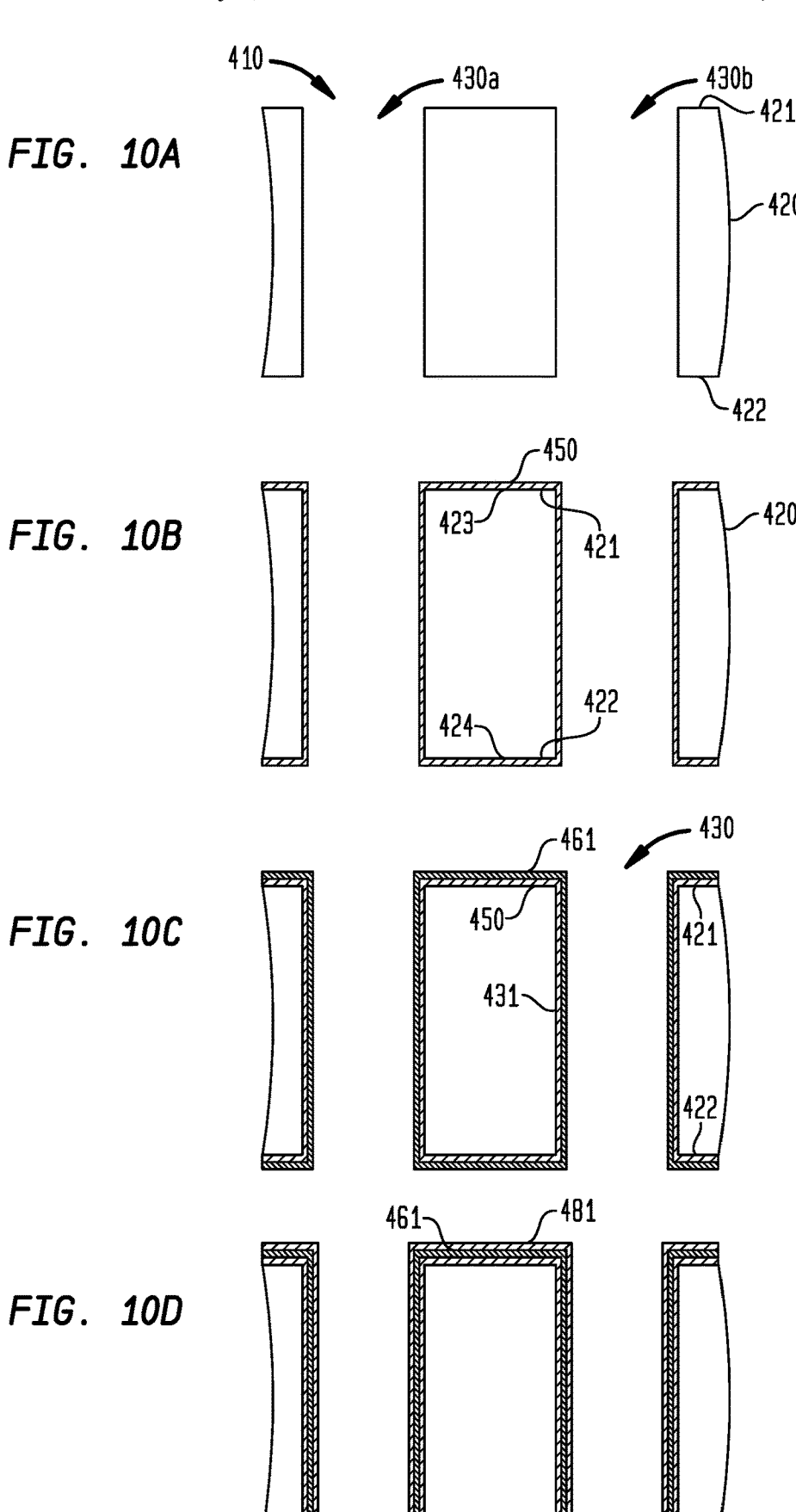
FIGS. 10A-10G are sectional views illustrating stages of fabrication in accordance with the embodiment of the invention depicted in FIG. 9.

A method of fabricating the component 410 (FIG. 9) will now be described, with reference to FIGS. 10A-10G. As illustrated in FIG. 10A, the through openings 430*a* and 430*b* can be formed extending through the thickness of the substrate 420 from the first surface 421 towards the second surface 422 of from the second surface towards the first surface. The through opening 430 can be formed using similar methods as those described above with respect to FIG. 2A.

Thereafter, as illustrated in FIG. 10B, an insulating dielectric layer 450 is formed on the inner surface 431 of each through opening 430 and on portions of the first surface 421 and the second surface 422 of the substrate 420, including portions 423 and 424 along the first and second surfaces between the through openings 430*a* and 430*b*. The insulating dielectric layer 450 can be formed using similar methods as those described above with respect to FIG. 2B.

Thereafter, as illustrated in FIG. 10C, the first conductive plate 461 can be formed overlying the insulating dielectric layer 450, at least within the through openings 430, such that a contour of the first plate conforms to contours of the inner surface 431 and portions of the first and second surfaces 421 and 422. The first plate 461 can be formed using similar methods as those described above with respect to FIG. 2C.

Figure 10E:
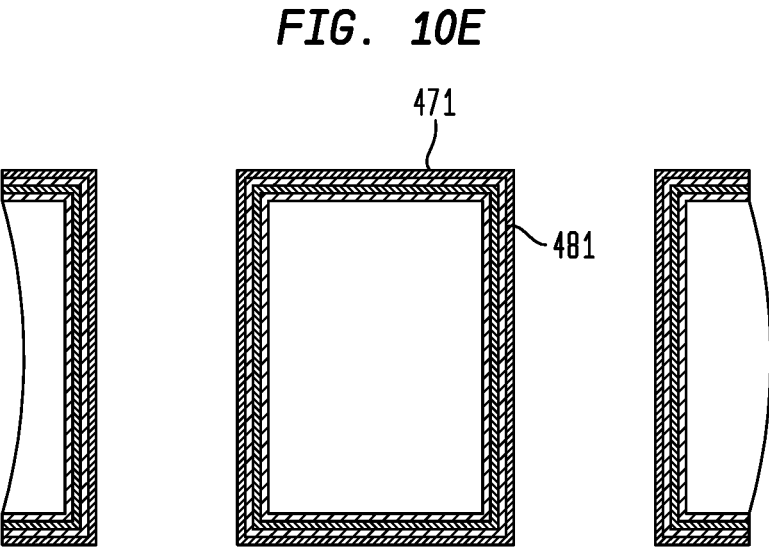

Thereafter, as illustrated in FIG. 10D, the first capacitor dielectric layer 481 can be formed overlying the first conductive plate 461. The first capacitor dielectric layer 481 can be formed using similar methods as described above with reference to the insulating dielectric layer 50 (FIG. 2B). Thereafter, as illustrated in FIG. 10E, the third conductive plate 471 can be formed overlying the first capacitor dielectric layer 481. The third conductive plate 471 can be formed using similar methods as those described above with reference to the first conductive plate 61 (FIG. 2C).

Figure 10F:
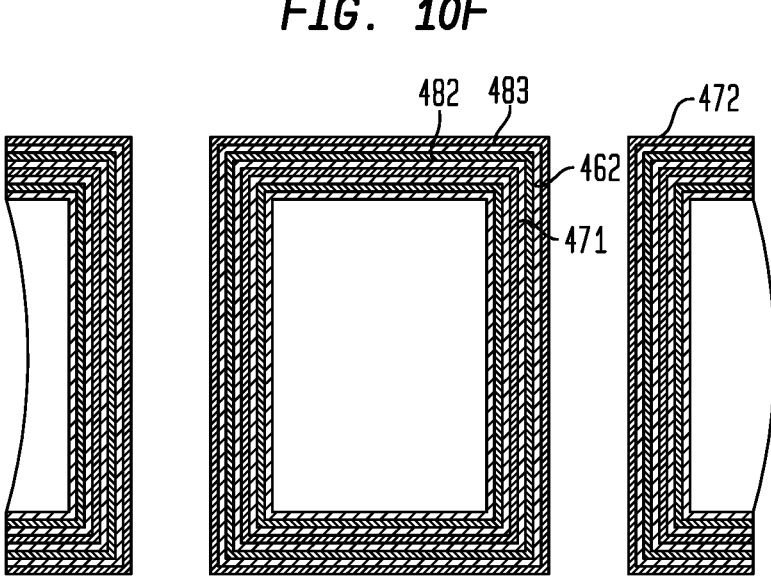

Thereafter, as illustrated in FIG. 10F, the second capacitor dielectric layer 482 can be formed overlying the third conductive plate 471, the second conductive plate 462 can be formed overlying the second capacitor dielectric layer, the third capacitor dielectric layer 483 can be formed overlying the second conductive plate, and the fourth conductive plate 472 can be formed overlying the third capacitor dielectric layer. The second and third capacitor dielectric layers 482 and 483 can be formed using similar methods as described above with reference to the insulating dielectric layer 50 (FIG. 2B). The second and fourth conductive plates 462 and 472 can be formed using similar methods as those described above with reference to the first conductive plate 61 (FIG. 2C).

Figure 10G:
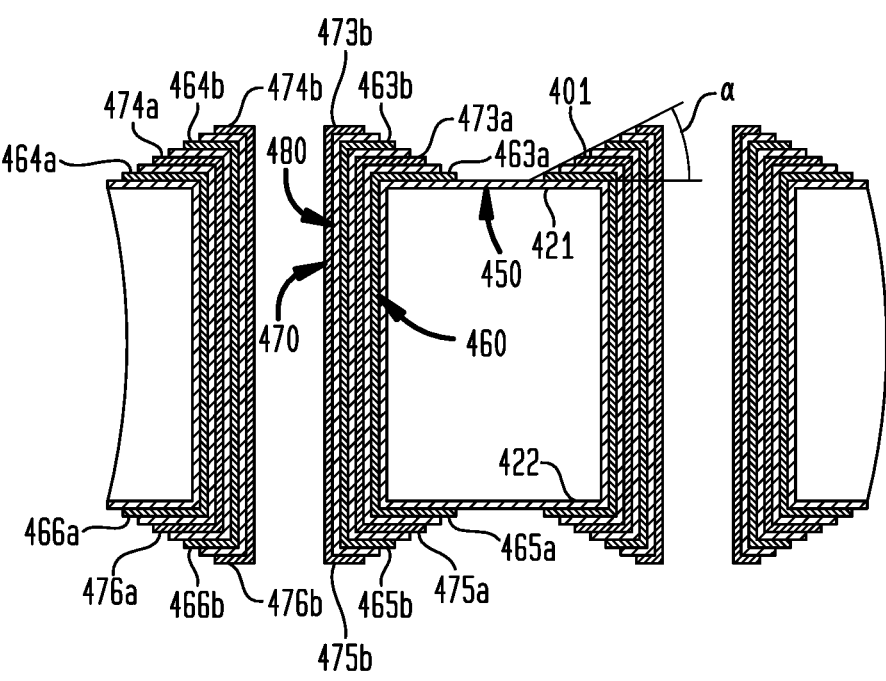

Thereafter, as illustrated in FIG. 10G, the first through sixteenth electrodes 463a through 466b and 473a through 476b (or lateral edges of the first and second plates 460 and 470 that can be connected to respective electrodes) can be exposed by removing a portion of the material from the first and second plates 460 and 470 and the dielectric layers 450 and 480. The target portions of the material can be removed, for example, by selectively etching the first and second plates 460 and 470 and the dielectric layers 450 and 480, after forming a mask layer where it is desired to preserve remaining portions of material. The target portions of the material can alternatively be removed using similar methods as those described above with reference to removal of material from the substrate 20 (FIG. 2A). In a preferred embodiment, the first through sixteenth electrodes 463a through 466b and 473a through 476b can be exposed along respective angles α between 0 and 90 degrees with respect to the front and rear surfaces 421 and 422, such as, for example, approximately 45 degrees. In the example where the angle α is 45 degrees, each of the first through sixteenth electrodes 463a through 466b and 473a through 476b can have an exposed outer surface 401 facing away from the respective first or second surface 421 or 422.

Thereafter, referring again to FIG. 9, the dielectric region 490 can be formed inside each through opening 430 and partially overlying the first and second surfaces 421 and 422. The dielectric region 490 can include an inorganic material, a polymeric material, or both. The dielectric region 490 can be formed using similar methods as described above with reference to the dielectric region 90 (FIG. 1). The dielectric region 490 can be deposited such that the first through fourth electrodes 463a through 464b and ninth through twelfth electrodes 473a through 474b are exposed at the first outer surface 491 of the dielectric region and the fifth through eighth electrodes 465a through 466b and the thirteenth through sixteenth electrodes 475a through 476b are exposed at the second outer surface 492.

Figure 11:
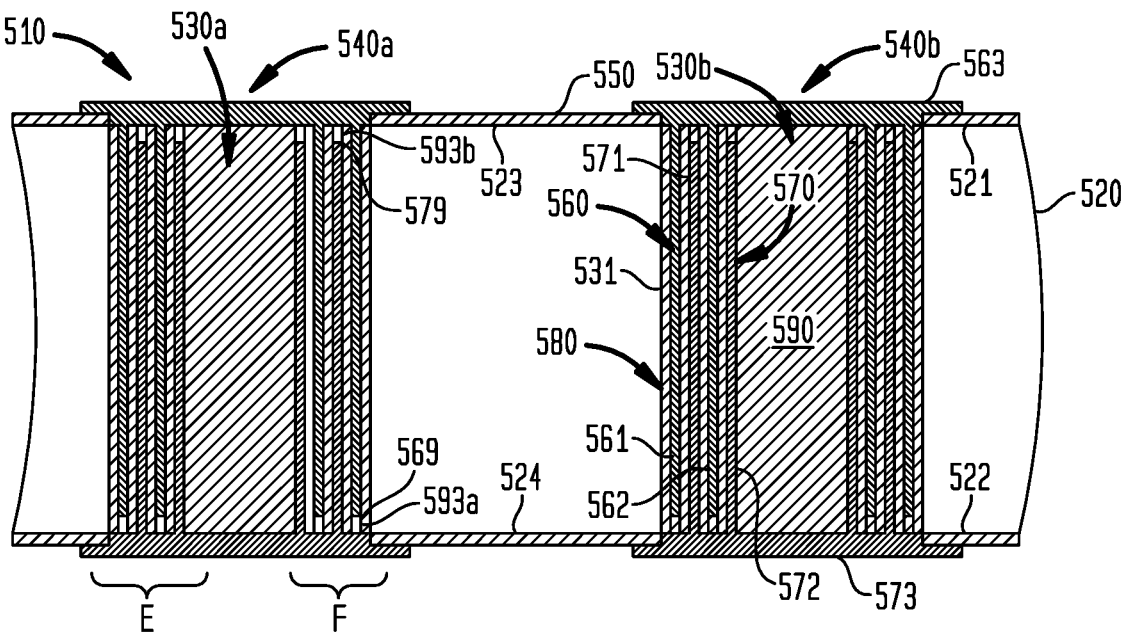
FIG. 11 is a sectional view illustrating a component in accordance with another embodiment.

With reference to FIG. 11, a component 510 according to an embodiment of the present invention includes a substrate 520 and capacitors 540a and 540b (collectively capacitors 540) formed in contact with the substrate. The substrate 520 has through openings 530a and 530b (collectively through openings 530) extending through the substrate between a planar first surface 521 and a planar second surface 522 opposite the first surface. Each capacitor 540 includes an insulating dielectric layer 550 overlying an inner surface 531 of the corresponding opening 530 and portions of the first and second surfaces 521 and 522, a first pair of electrically conductive plates 560, a second pair of electrically conductive plates 570, and a plurality of capacitor dielectric layers 580 separating each of the plates 560 and 570 from at least one adjacent plate. A dielectric region 590 occupies the remaining volume within each corresponding opening 530 that is not occupied by the plates 560 and 570 and the dielectric layers 550 and 580.

The substrate 520, each through opening 530, the inner surface 531 of each respective through opening, the insulating dielectric layer 550, and the plurality of capacitor dielectric layers 580 are similar to the corresponding elements of the component 410 disclosed above with reference to FIGS. 9 through 10G.

The first pair of electrically conductive plates 560 includes a first plate 561 overlying the insulating dielectric layer 550 within the respective opening 530 and a second plate 562 overlying the first plate. At the first surface 521 of the substrate 520, the first pair of plates 560 can be connected to a single first electrode 563 exposed at the first surface, the first electrode being connectable with a first electric potential. The first electrode 563 can optionally be a plurality of electrodes exposed at the first surface, such that a portion of the first electrode extending between the inner surfaces 531 can be covered by an overlying dielectric layer except where exposed for interconnection with another element external to the capacitor 540.

The second pair of electrically conductive plates 570 includes a third plate 571 overlying the first plate 561 and a fourth plate 572 overlying the second plate 562. At the second surface 522 of the substrate 520, the second pair of plates 570 can be connected to a single second electrode 573 exposed at the second surface, second electrode being connectable with a second electric potential. The second electrode 573 can optionally be a plurality of electrodes exposed at the second surface, such that a portion of the second electrode extending between the inner surfaces 531 can be covered by an overlying dielectric layer except where exposed for interconnection with another element external to the capacitor 540.

Each dielectric region 590 occupies the remaining volume within the corresponding opening 530 that is not occupied by the plates 560 and 570 and the dielectric layers 550 and 580. Each dielectric region 590 can provide good dielectric isolation between the fourth plate 572 and the first electrode 563.

The component 510 further includes a plurality of dielectric portions 593a and 593b (collectively dielectric portions 593), each dielectric portion 593a extending between a respective distal edge 569 of a corresponding first plate 560 and the second electrode 573, and each dielectric portion 593b extending between a respective distal edge 579 of a corresponding second plate 570 and the first electrode 563.

In one embodiment, the first and second pairs of plates 560 and 570 can have an annular shape extending around a corresponding opening 530 having a circular or oval cross-sectional shape. In a particular embodiment, the component 510 can include two sets of first and second pairs of plates 560 and 570 extending through a single through opening 530a, each set of first and second pairs of plates comprising a respective region E or F of the component with the insulating dielectric region 590 extending therebetween.

Figure 12A:
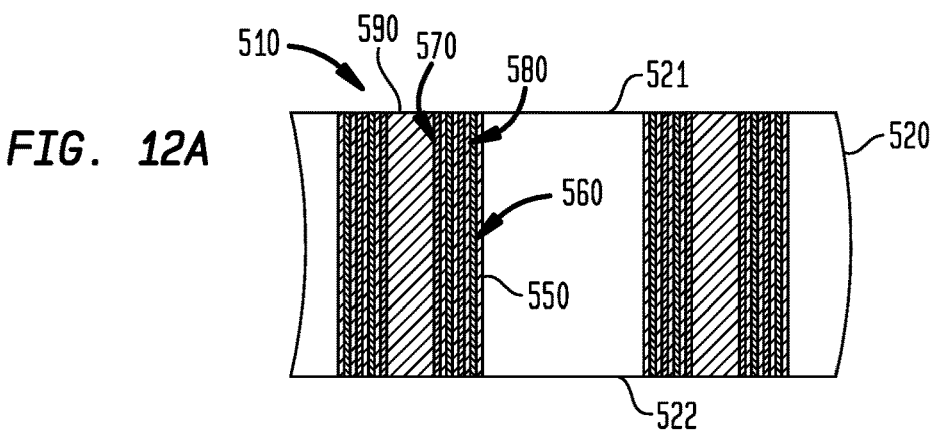
FIGS. 12A-12D are sectional views illustrating stages of fabrication in accordance with the embodiment of the invention depicted in FIG. 11.

A method of fabricating the component 510 (FIG. 11) will now be described, with reference to FIGS. 12A-12D. The method of fabricating the component 510 can begin with the steps described above with reference to the component 410 shown in FIGS. 10A-10F. Thereafter, as illustrated in FIG. 12A, the first and second pairs of plates 560 and 570, the dielectric layers 550 and 580, and the dielectric region 590 can be planarized with the first and second surfaces 521 and 522 of the substrate 520. For example, grinding, lapping, or polishing of the first and second surfaces 521 and 522 or a combination thereof can be used to planarize the component 510.

Figure 12B:
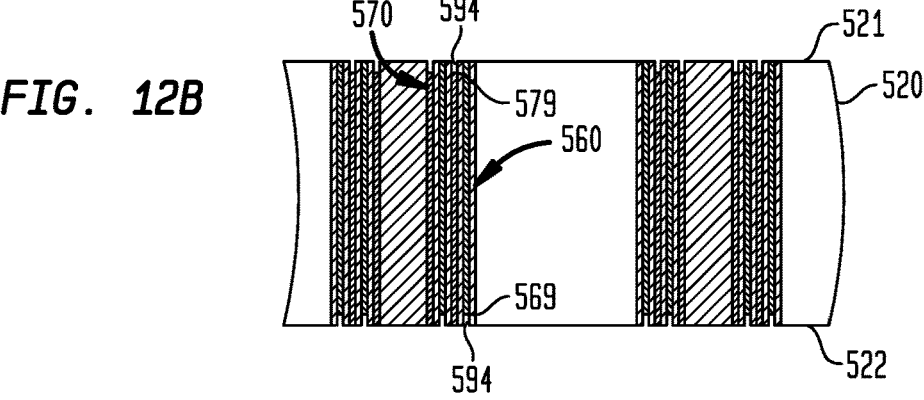

Thereafter, as illustrated in FIG. 12B, the distal edges 569 and 579 of the respective first and second pairs of plates 560 and 570 can be partially recessed below the planes defined by the respective second and first surfaces 522 and 521 of the substrate 520 by removing a portion of the material from the first and second pairs of plates adjacent the respective second and first surfaces, thereby forming a plurality of recesses 594 extending between the distal edges 569 and 579 and the respective second and first surfaces. The target portions of the material can be removed, for example, by selectively etching the first and second plates 560 and 570. The target portions of the material can alternatively be removed using similar methods as those described above with reference to removal of material from the substrate 20 (FIG. 2A).

The distal edges 569 of the first pair of plates 560 can be recessed below the second surface 522 so that the first pair of plates does not contact the second electrode 573 when it is later formed at the second surface (FIG. 11), and the distal edges 579 of the second pair of plates 570 can be recessed below the first surface 521 so that the second pair of plates does not contact the first electrode 563 when it is later formed at the first surface (FIG. 11).

Figure 12C:
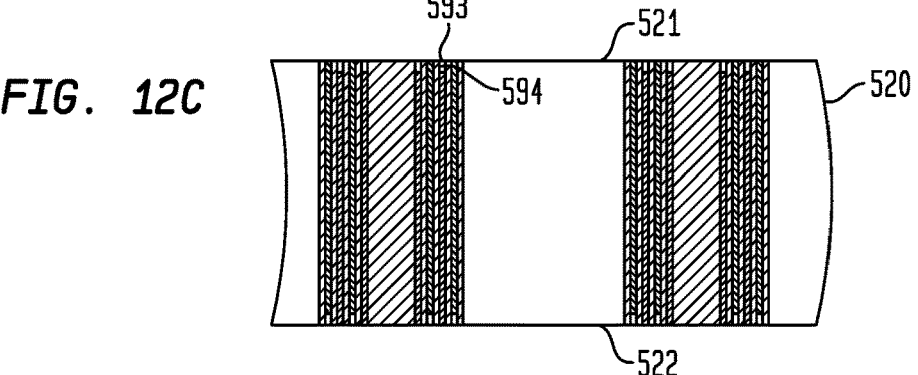

Thereafter, as illustrated in FIG. 12C, the dielectric portions 593 can each be formed within a respective recess 594, and the dielectric portions can be planarized with the first and second surfaces 521 and 522 of the substrate 520. For example, grinding, lapping, or polishing of the first and second surfaces 521 and 522 or a combination thereof can be used to planarize the dielectric portions 593. Alternatively, a self-planarizing dielectric material can be used to form the dielectric portions 593.

Figure 12D:
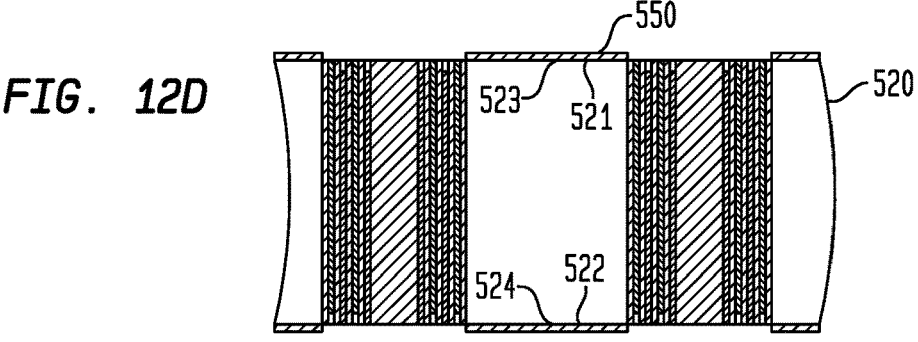

Thereafter, as illustrated in FIG. 12D, the portions of the insulating dielectric layer 550 that may have been removed during the step illustrated in FIG. 12A can be reformed on portions of the first and second surfaces 521 and 522 of the substrate 520, including portions 523 and 524 along the first and second surfaces between the through openings 530a and 530b. The portions of the insulating dielectric layer 550 can be formed, for example, using similar methods as those described above with respect to FIG. 2B.

Thereafter, referring again to FIG. 11, the first and second electrodes 563 and 573 can be formed at the respective first and second surfaces 521 and 522 of the substrate 520. The first electrode 563 can be formed at the first surface 521 such that the first electrode is connected to the first pair of plates 560, but such that the first electrode is spaced apart from the distal ends 579 of the second pair of plates 570 by the plurality of dielectric portions 593b. The second electrode 573 can be formed at the second surface 522 such that the second electrode is connected to the second pair of plates 570, but such that the second electrode is spaced apart from the distal ends 569 of the first pair of plates 560 by the plurality of dielectric portions 593a. Each of the first and second electrodes 563 and 573 can be formed such that they at least partially overlie the portions 523 and 524 of the substrate 520 between the through openings 530a and 530b. The first and second electrodes 563 and 573 can be formed, for example, using similar methods as those described above with respect to FIG. 2C.

Figure 13:
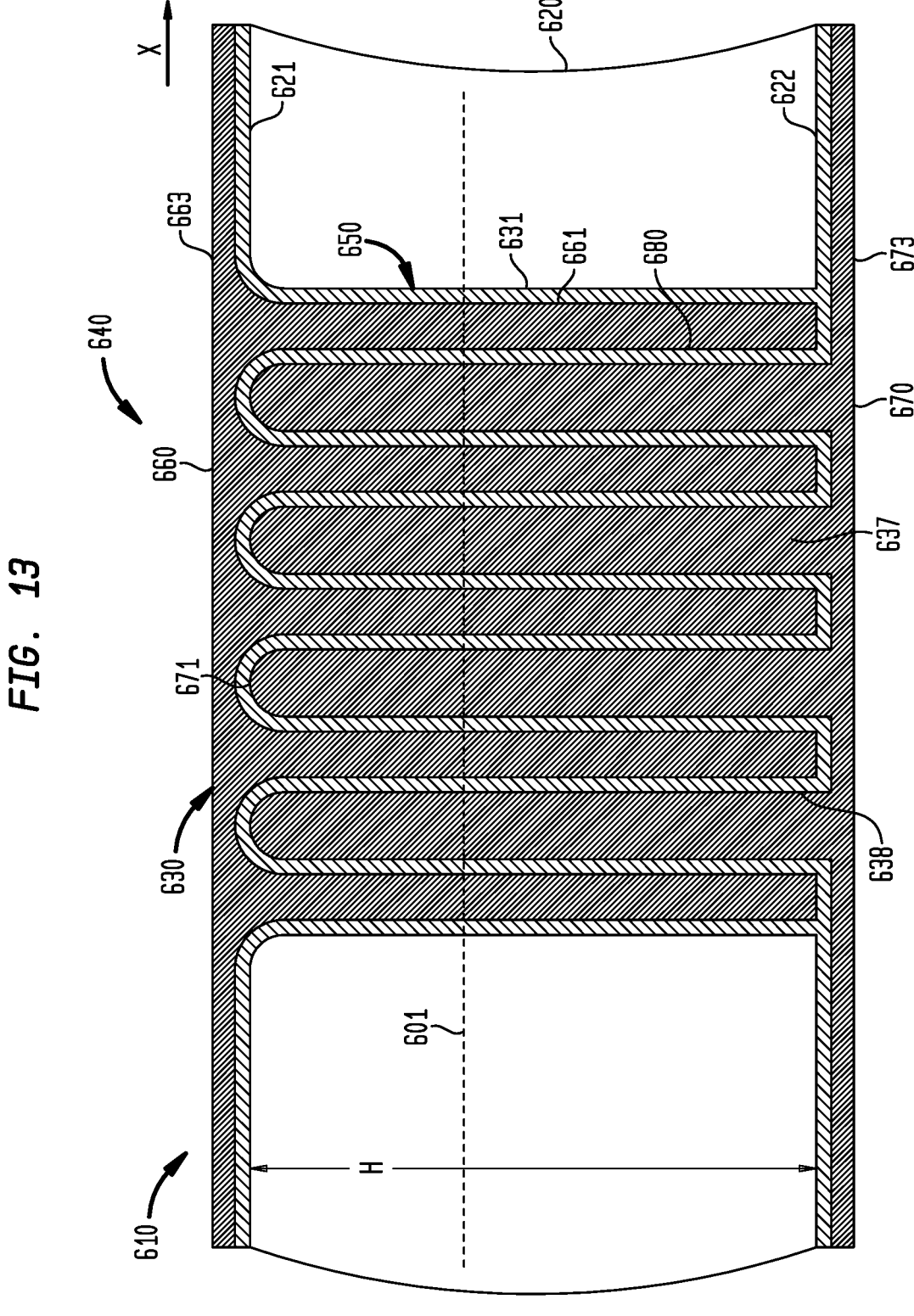
FIG. 13 is a sectional view illustrating a capacitor in accordance with another embodiment.

With reference to FIG. 13, a component 610 according to an embodiment of the present invention includes a substrate 620 and a capacitor 640 formed in contact with the substrate. The substrate 620 has a through opening 630 extending through the substrate between a planar first surface 621 and a planar second surface 622 opposite the first surface. The capacitor 640 includes an insulating dielectric layer 650 overlying substrate boundary surfaces 631 (or inner surfaces) of the opening 630 and portions of the first and second surfaces 621 and 622, first and second electrically conductive elements 660 and 670 (or first and second metal elements), and a capacitor dielectric layer 680 separating the first and second electrically conductive elements and having an undulating shape.

The substrate 620, the through opening 630, the substrate boundary surfaces 631 (or inner surfaces) of the through opening, and the insulating dielectric layer 650 are similar to the corresponding elements of the component 410 disclosed above with reference to FIGS. 9 through 10G.

The first electrically conductive element 660 includes a first plurality of vertically-extending plates 661 overlying the insulating dielectric layer 650 within the opening 630. At the first surface 621 of the substrate 620, the first plurality of plates 660 can be connected to a single first electrode 663 exposed at the first surface, the first electrode being connectable with a first electric potential. Each of the first plates 661 can have a width in a direction along the first surface 621 of at least 5 microns. The first electrode 663 can optionally be a plurality of electrodes exposed at the first surface, such that a portion of the first electrode extending between the plurality of electrodes can be covered by an overlying dielectric layer except where exposed for interconnection with another element external to the capacitor 640.

The second electrically conductive element 670 includes a second plurality of vertically-extending plates 671, each second plate extending between adjacent ones of the first plates 661. At the second surface 622 of the substrate 620, the second plurality of plates 671 can be connected to a single second electrode 673 exposed at the second surface, second electrode being connectable with a second electric potential. Each of the second plates 671 can have a width in a direction along the first surface 621 of at least 5 microns. The second electrode 673 can optionally be a plurality of electrodes exposed at the second surface, such that a portion of the second electrode extending between the plurality of electrodes can be covered by an overlying dielectric layer except where exposed for interconnection with another element external to the capacitor 640.

The capacitor dielectric layer 680 can separate and insulate the first and second electrically conductive elements 660 and 670 from one another. The capacitor dielectric layer 680 can have an undulating shape, at least within the opening 630. As used herein, a capacitor dielectric layer having an "undulating" shape means that the dielectric layer has a wavelike shape, such that an imaginary line 601 parallel to a direction of undulation (e.g., the "X" direction in FIG. 13) intersects the dielectric layer at least three times. In a particular embodiment, an undulating first surface 636 and an undulating second surface 638 of the capacitor dielectric layer 680 (and the other undulating dielectric layers described herein) each have a length along the respective surfaces at least triple the height H of the opening 630 between the first and second surfaces 631 and 632.

In one embodiment, the first and second pluralities of plates 661 and 671 can have annular shapes extending within an opening 630 having a circular or oval cross-sectional shape. In a particular embodiment, the first and second pluralities of plates 661 and 671 can have planar shapes extending substantially parallel to one another and to the substrate boundary surfaces 631 of an opening 630 having a square or rectangular cross-sectional shape.

Figure 14A:
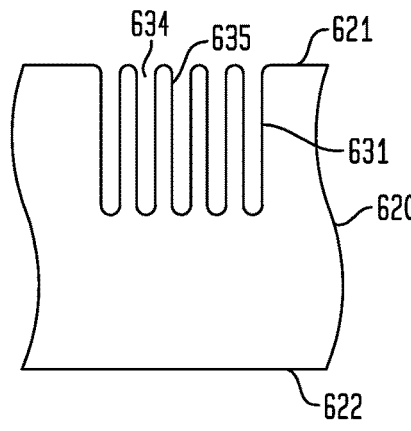
FIGS. 14A-14G are sectional views illustrating stages of fabrication in accordance with the embodiment of the invention depicted in FIG. 13.

A method of fabricating the component 610 (FIG. 13) will now be described, with reference to FIGS. 14A-14G. As illustrated in FIG. 14A, material can be removed from the first surface 621 of the substrate 620 to form a plurality of first openings 634 extending from the first surface towards the second surface 622, the first openings defining an undulating inner surface 635 and substrate boundary surfaces 631. The substrate boundary surfaces 631 define portions of the exposed surfaces within the first openings 634 that will later form the boundary of the through opening 630 (FIG. 13). The first openings 634 can be formed using similar methods as those described above with respect to FIG. 2A.

Figure 14B:
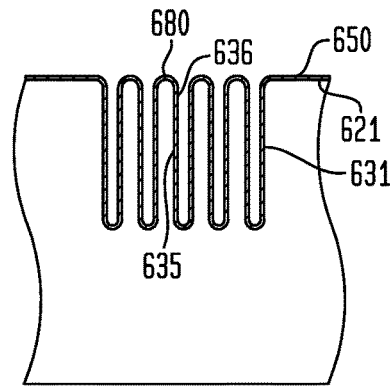

Thereafter, as illustrated in FIG. 14B, an insulating dielectric layer 650 and a capacitor dielectric layer 680 are formed. The insulating dielectric layer 650 is formed overlying the substrate boundary surfaces 631 and portions of the first surface 621, and the capacitor dielectric layer 680 is formed overlying the undulating inner surface 635. The capacitor dielectric layer 680 has an undulating first surface 636 facing away from the inner surface 635. The dielectric layers 650 and 680 can be formed using similar methods as those described above with respect to FIG. 2B. In a particular embodiment, the dielectric layers 650 and 680 can be made from the same dielectric material, for example, during a single formation process. In another embodiment, the dielectric layers 650 and 680 can be made from different dielectric materials, for example, during separate formation processes.

Figure 14C:
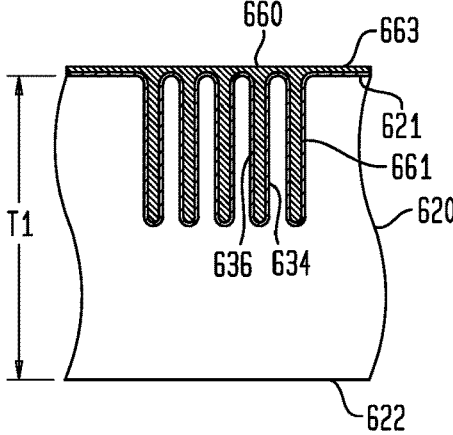

Thereafter, as illustrated in FIG. 14C, the first electrically conductive element 660 can be formed overlying the undulating first surface 636 and extending into each of the first openings 634. The first electrically conductive element 660 can include the first plurality of vertically-extending plates 661 and the first electrode 663, the first electrode being exposed at the first surface 621. The first conductive element 660 can be formed using similar methods as those described above with respect to FIG. 2C.

Figure 14D:
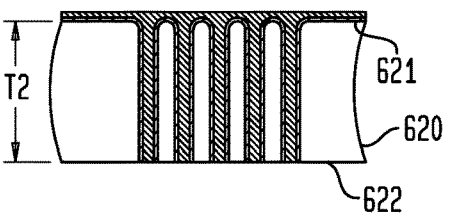

Thereafter, as illustrated in FIG. 14D, the thickness of the substrate 620 between the first and second surfaces 621 and 622 can be reduced, thereby exposing distal edges 669 of the first plurality of plates 661. Grinding, lapping, or polishing of the second surface 622 or a combination thereof can be used to reduce the thickness of the substrate 620. During this step, as an example, the initial thickness T1 (shown in FIG. 14C) of the substrate 620 can be reduced from about 700 μm to a thickness T2 (shown in FIG. 14D) of about 130 μm or less.

Figure 14E:
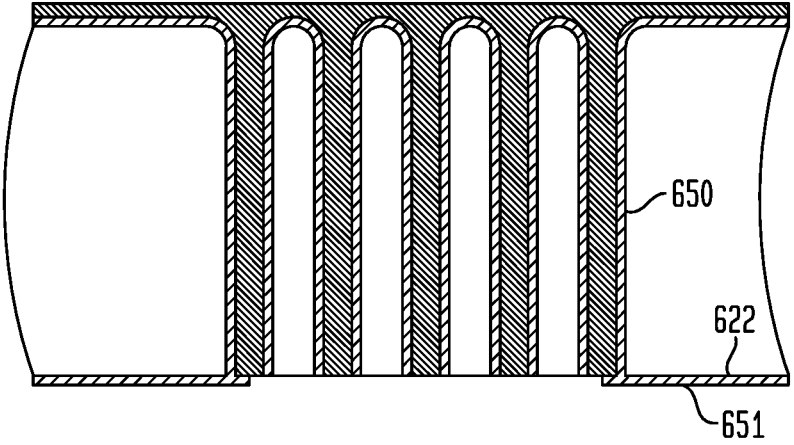
Figure 14F:
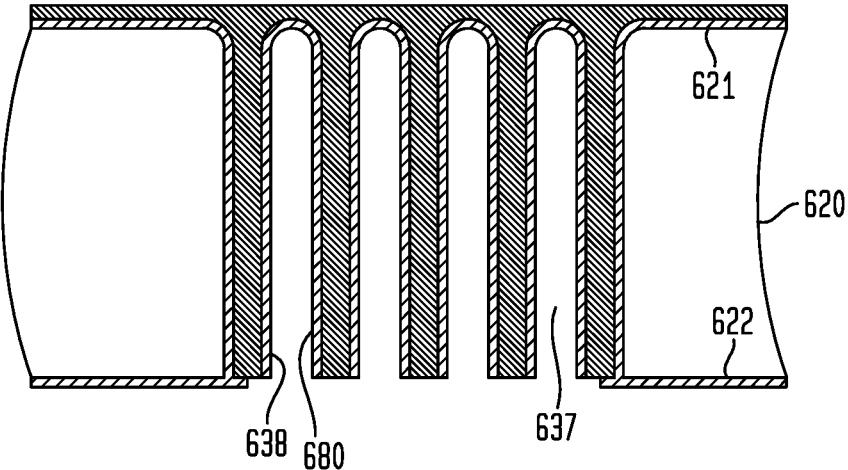

Thereafter, as illustrated in FIG. 14E, additional portions 651 of the insulating dielectric layer 650 can be formed overlying the second surface 622, except at portions of the second surface where it is desired to form a plurality of second openings 637 (FIG. 14F). The additional portions 651 of the insulating dielectric layer 650 can be formed using similar methods as those described above with respect to FIG. 2B.

Thereafter, as illustrated in FIG. 14F, material can be removed from the second surface 622 of the substrate 620 to expose an undulating second surface 638 of the capacitor dielectric layer 680, thereby forming the plurality of second openings 637 extending from the second surface towards the first surface 621. The second openings 637 can be formed using similar methods as those described above with respect to FIG. 2A.

Figure 14G:
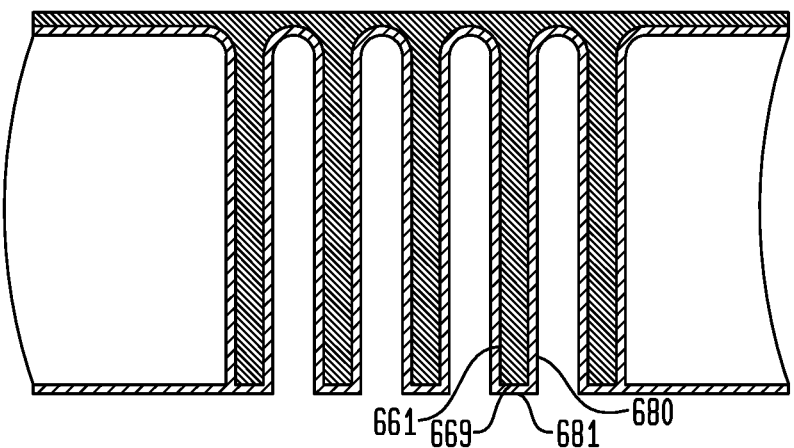

Thereafter, as illustrated in FIG. 14G, additional portions 681 of the capacitor dielectric layer 680 can be formed overlying the distal edges 669 of the first plurality of plates 661. The additional portions of the dielectric layer 680 can be formed using similar methods as those described above with respect to FIG. 2B.

Thereafter, referring again to FIG. 13, the second electrically conductive element 670 can be formed overlying the second surface 638 of the capacitor dielectric layer 680 and extending into each of the second openings 637. The second electrically conductive element 670 can include the second plurality of vertically-extending plates 671 and the second electrode 673, the second electrode being exposed at the second surface 622. The second conductive element 670 can be formed using similar methods as those described above with respect to FIG. 2C.

Figure 15:
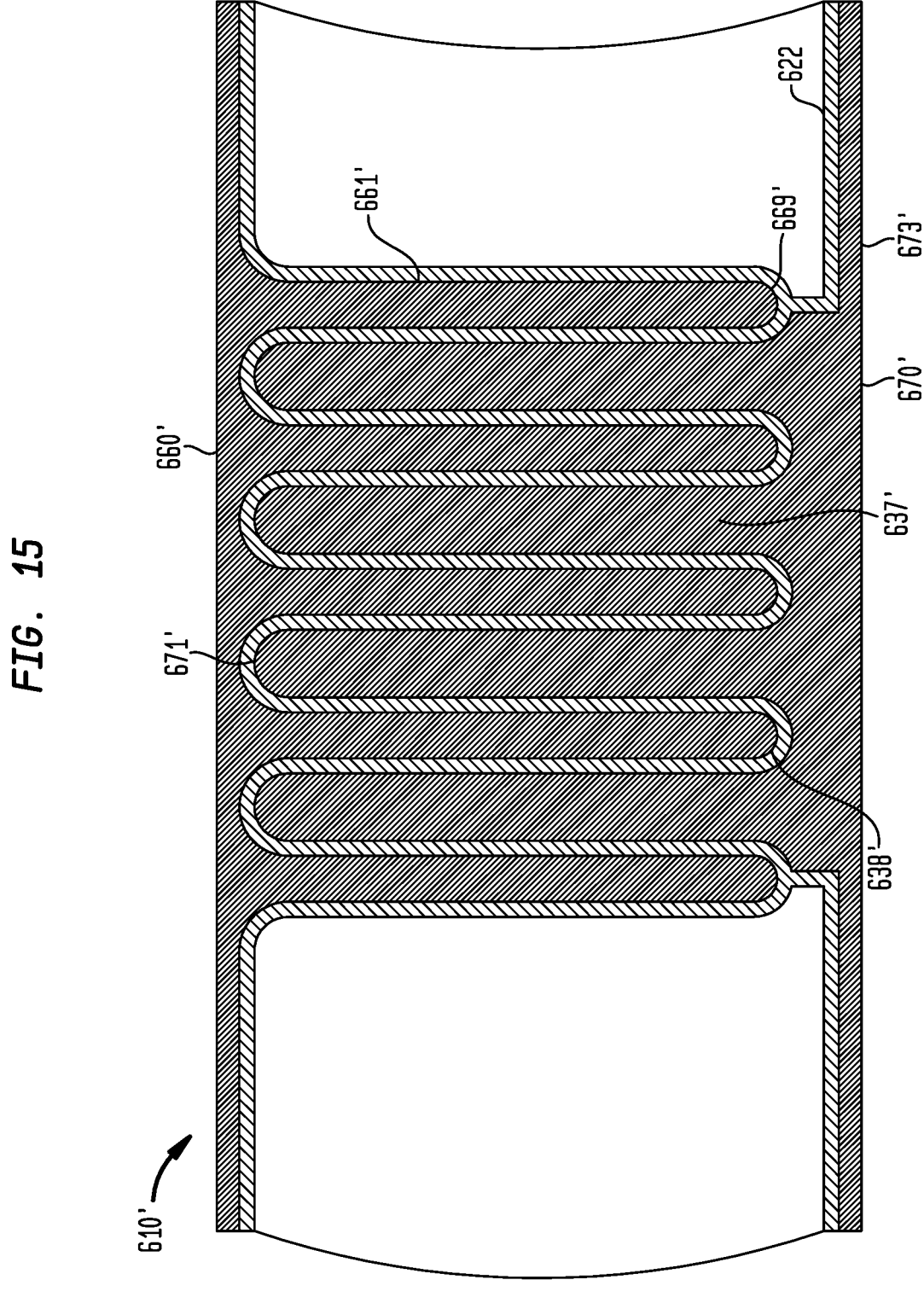
FIG. 15 is a sectional view illustrating a capacitor in accordance with another embodiment.

FIG. 15 illustrates a variation of the component of FIG. 13 having an alternate configuration. The component 610' is similar to the component 610 described above, except that the component 610' includes a first electrically conductive element 660' having a first plurality of vertically-extending plates 661', each of the first plurality of plates having a rounded distal edge 669' that is recessed below the second surface 622.

Figure 16A:
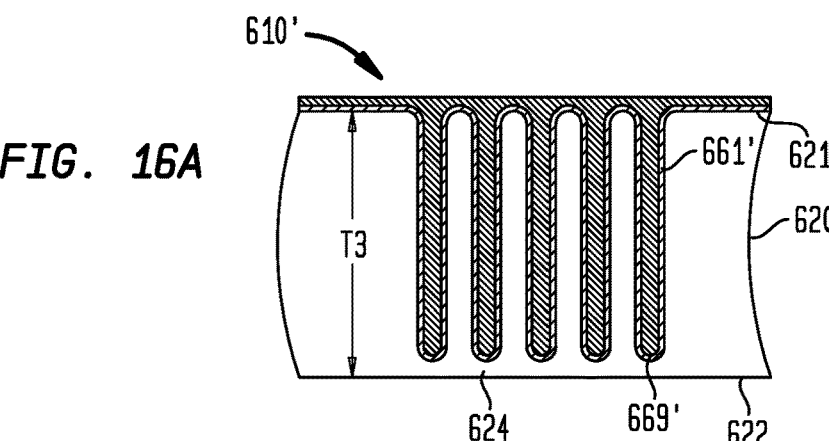
FIGS. 16A-16D are sectional views illustrating stages of fabrication in accordance with the embodiment of the invention depicted in FIG. 15.

A method of fabricating the component 610' (FIG. 15) will now be described, with reference to FIGS. 16A-16D. The method of fabricating the component 610' can begin with the steps described above with reference to the component 610 shown in FIGS. 14A-14C. Thereafter, as illustrated in FIG. 16A, the thickness of the substrate 620 between the first and second surfaces 621 and 622 can be reduced. However, the distal edges 669' of the first plurality of plates 661' are not exposed, whereby a portion 624 of the substrate remains between the distal edges of the first plurality of plates and the second surface 622. Grinding, lapping, or polishing of the second surface 622 or a combination thereof can be used to reduce the thickness of the substrate 620. During this step, as an example, the initial thickness T1 (shown in FIG. 14C) of the substrate 620 can be reduced from about 700 μm to a thickness T3 (shown in FIG. 16A) of about 130 μm or less.

Figure 16B:
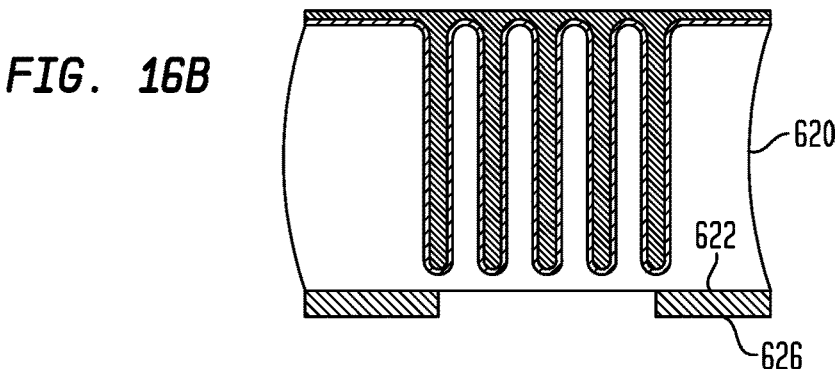

Thereafter, as illustrated in FIG. 16B, a mask layer 626 can be applied to the second surface 622 of the substrate 620 where it is desired to preserve remaining portions of the second surface. For example, the mask layer 626 can be a photoimageable layer, e.g., a photoresist layer, which can be deposited and patterned to cover only portions of the second surface 622.

Figure 16C:
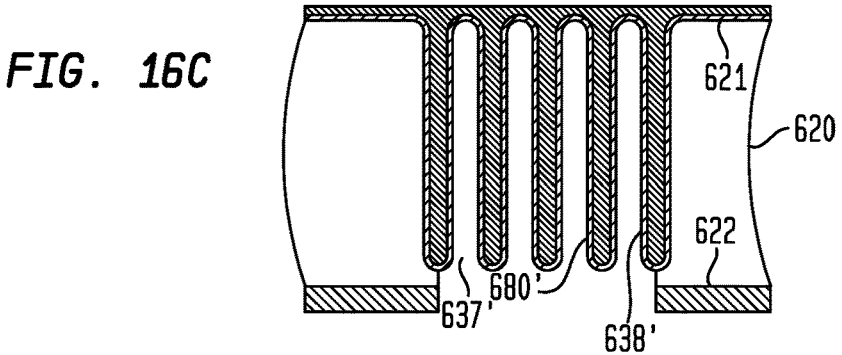

Thereafter, as illustrated in FIG. 16C, material can be removed from the second surface 622 of the substrate 620 to expose an undulating second surface 638' of the capacitor dielectric layer 680', thereby forming the plurality of second openings 637' extending from the second surface towards the first surface 621. The second openings 637' can be formed using similar methods as those described above with respect to FIG. 2A.

Figure 16D:
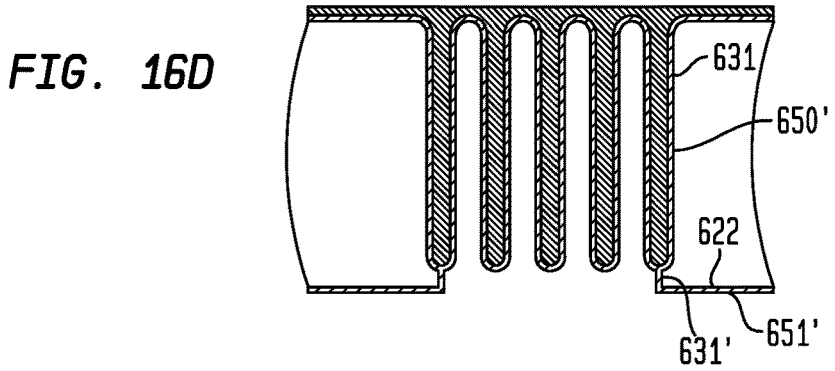

Thereafter, as illustrated in FIG. 16D, the mask layer 626 can be removed, and additional portions 651' of the insulating dielectric layer 650' can be formed overlying the second surface 622 and exposed portions 631' of the substrate boundary surfaces 631. The additional portions 651' of the insulating dielectric layer 650' can be formed using similar methods as those described above with respect to FIG. 2B.

Thereafter, referring again to FIG. 15, the second electrically conductive element 670' can be formed overlying the second surface 638' of the capacitor dielectric layer 680' and extending into each of the second openings 637'. The second electrically conductive element 670' can include the second plurality of vertically-extending plates 671' and the second electrode 673', the second electrode being exposed at the second surface 622. The second conductive element 670' can be formed using similar methods as those described above with respect to FIG. 2C.

Figure 17:
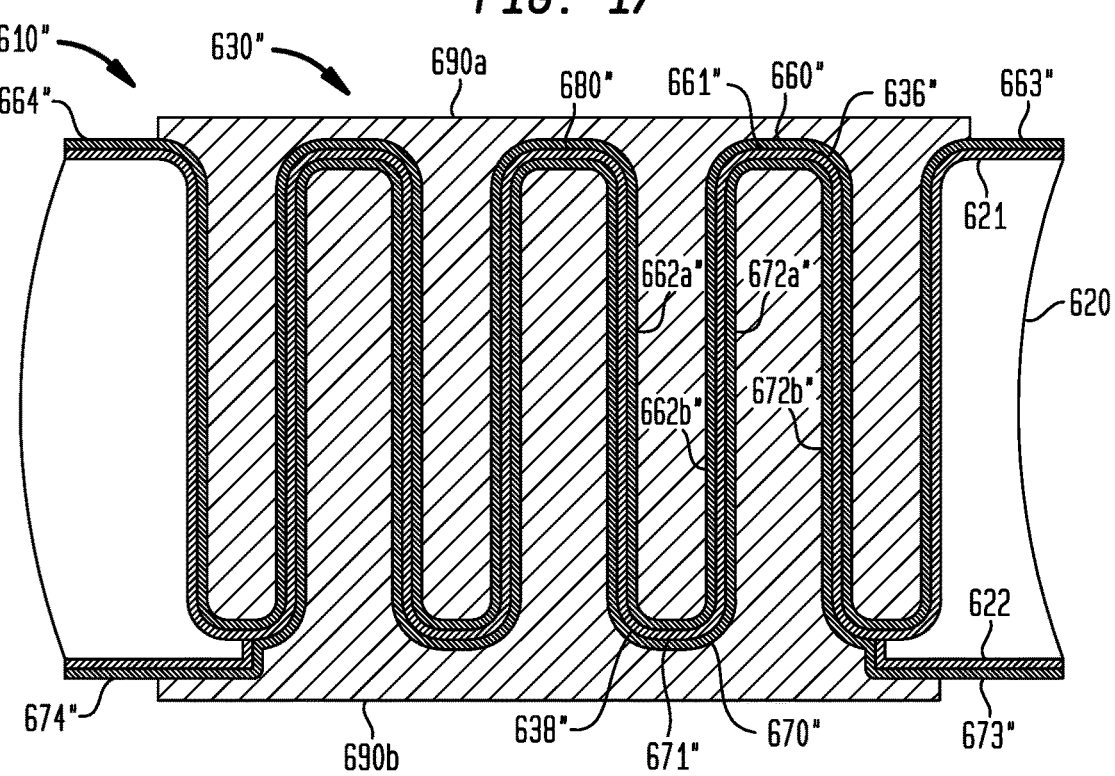
FIG. 17 is a sectional view illustrating a capacitor in accordance with another embodiment.

FIG. 17 illustrates another variation of the component of FIG. 13 having an alternate configuration. The component 610″ is similar to the component 610 described above, except that the component 610″ includes first and second electrically conductive elements 660″ and 670″ (or first and second metal elements) having surfaces that conform to a contour of the surface of the capacitor dielectric layer 680″, whereby dielectric regions 690a and 690b (collectively dielectric regions 690) fill a portion of the opening 630″ that is not occupied by the first and second electrically conductive elements and the capacitor dielectric layer.

The first electrically conductive element 660″ has a first surface 661″ that overlies and conforms to a contour of an undulating first surface 636″ of the capacitor dielectric layer 680″. A first dielectric region 690a fills a portion of the opening 630″ that is not occupied by the first and second electrically conductive elements and the capacitor dielectric layer, whereby the first dielectric region separates a first portion 662a″ of the first electrically conductive element 660″ from an adjacent second portion 662b″ thereof that is substantially parallel to the first portion. At the first surface 621 of the substrate 620, the first electrically conductive element 660″ can be connected to first and second electrodes 663″ and 664″ exposed at the first surface, the first electrode being connectable with a first electric potential.

The second electrically conductive element 670″ has a second surface 671″ that overlies and conforms to a contour of an undulating second surface 638″ of the capacitor dielectric layer 680″. A second dielectric region 690b fills a portion of the opening 630″ that is not occupied by the first and second electrically conductive elements and the capacitor dielectric layer, whereby the second dielectric region separates a first portion 672a″ of the second electrically conductive element 670″ from an adjacent second portion 672b″ thereof that is substantially parallel to the first portion. At the second surface 622 of the substrate 620, the second electrically conductive element 670″ can be connected to third and fourth electrodes 673″ and 674″ exposed at the second surface, the second electrode being connectable with a second electric potential.

Figure 18:
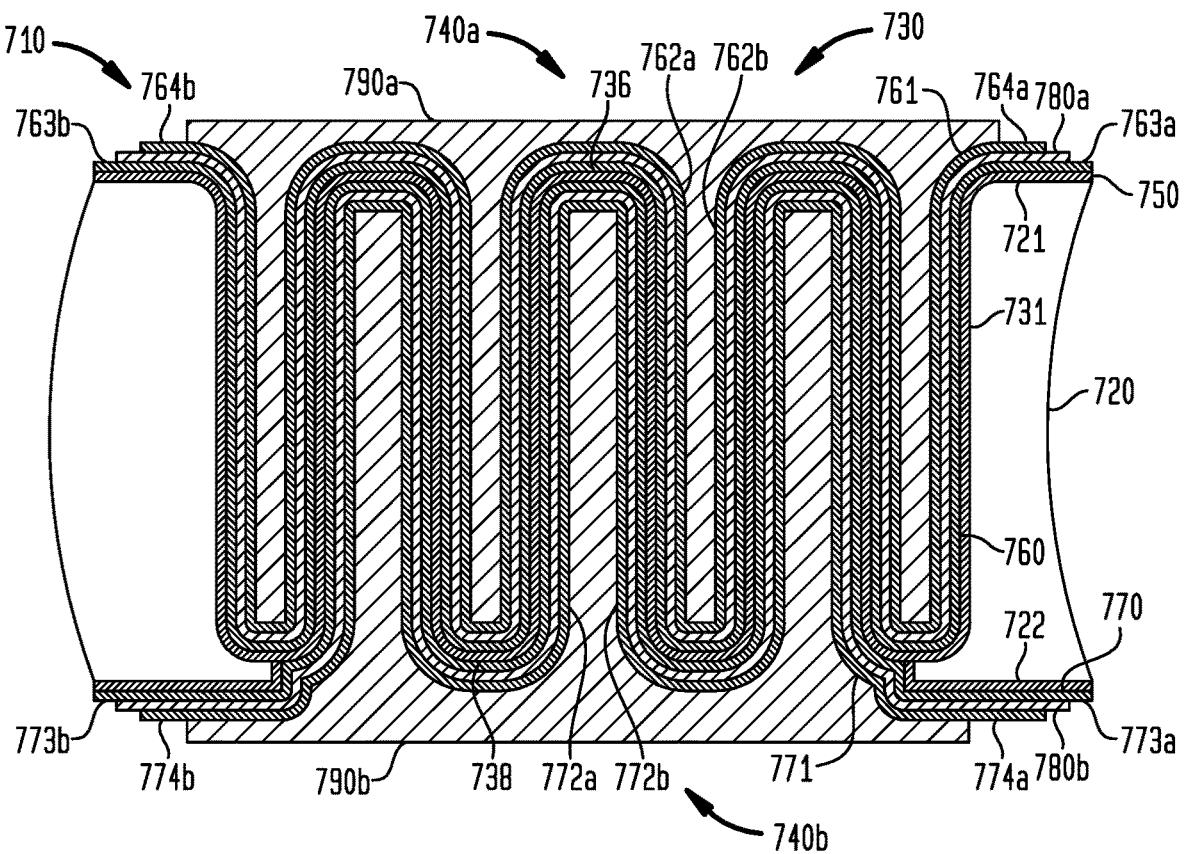
FIG. 18 is a sectional view illustrating a capacitor structure in accordance with another embodiment.

With reference to FIG. 18, a capacitor structure 710 according to an embodiment of the present invention includes a substrate 720 and first and second capacitors 740a and 740b (collectively capacitors 740) formed in contact with the substrate. The substrate 720 has a through opening 730 extending through the substrate between a planar first surface 721 and a planar second surface 722 opposite the first surface. The capacitor structure 710 further includes an insulating dielectric layer 750 extending between the first and second capacitors 740a and 740b, and overlying the substrate boundary surfaces 731 of the opening 730 and portions of the first and second surfaces 721 and 722.

The first capacitor 740a includes first and second electrically conductive elements 760 and 761 (or first and second metal elements), and a capacitor dielectric layer 780a extending therebetween. The second capacitor 740b includes third and fourth electrically conductive elements 770 and 771 (or third and fourth metal elements), and a capacitor dielectric layer 780b extending therebetween. First and second dielectric regions 790a and 790b (collectively the dielectric region 790) occupies the remaining volume within the opening 730 that is not occupied by the conductive elements 760, 761, 770, and 771, and the dielectric layers 750, 780a, and 780b.

The substrate 720, the through opening 730, and the substrate boundary surfaces 731 (or inner surfaces) of the through opening, are similar to the corresponding elements of the component 410 disclosed above with reference to FIGS. 9 through 10G.

The insulating dielectric layer 750 can separate and insulate the first and second capacitors 740a and 740b from one another, at least within the opening 730. In a particular embodiment, the insulating dielectric layer 750 can separate and insulate the first and third conductive elements 760 and 770 from one another, at least within the opening 730. The insulating dielectric layer 750 can have an undulating shape, at least within the opening 730.

The first and second electrically conductive elements 760 and 761 overlie an undulating first surface 736 of the insulating dielectric layer 750 within the opening 730. A first capacitor dielectric layer 780a can separate and insulate the first and second conductive elements 760 and 761 from one another at least within the opening 730. At the first surface 721 of the substrate 720, the first conductive element 760 can be connected to first and second electrodes 763a and 763b exposed at the first surface, the first and second electrodes being connectable with a first electric potential. At the first surface 721 of the substrate 720, the second conductive element 761 can be connected to third and fourth electrodes 764a and 764b exposed at the first surface, the third and fourth electrodes being connectable with a third electric potential. A first dielectric region 790a fills a portion of the opening 730 that is not occupied by the conductive elements and the dielectric layers, whereby the first dielectric region separates a first portion 762a of the second electrically conductive element 761 from an adjacent second portion 762b thereof that is substantially parallel to the first portion.

The third and fourth electrically conductive elements 770 and 771 overlie an undulating second surface 738 of the insulating dielectric layer 750 within the opening 730. A second capacitor dielectric layer 780b can separate and insulate the third and fourth conductive elements 770 and 771 from one another at least within the opening 730. At the second surface 722 of the substrate 720, the third conductive element 770 can be connected to fifth and sixth electrodes 773a and 773b exposed at the second surface, the fifth and sixth electrodes being connectable with a third electric potential. At the second surface 722 of the substrate 720, the fourth conductive element 771 can be connected to seventh and eighth electrodes 774a and 774b exposed at the second surface, the seventh and eighth electrodes being connectable with a fourth electric potential. A second dielectric region 790b fills a portion of the opening 730 that is not occupied by the conductive elements and the dielectric layers, whereby the second dielectric region separates a first portion 772a of the fourth electrically conductive element 771 from an adjacent second portion 772b thereof that is substantially parallel to the first portion.

Figure 19F:
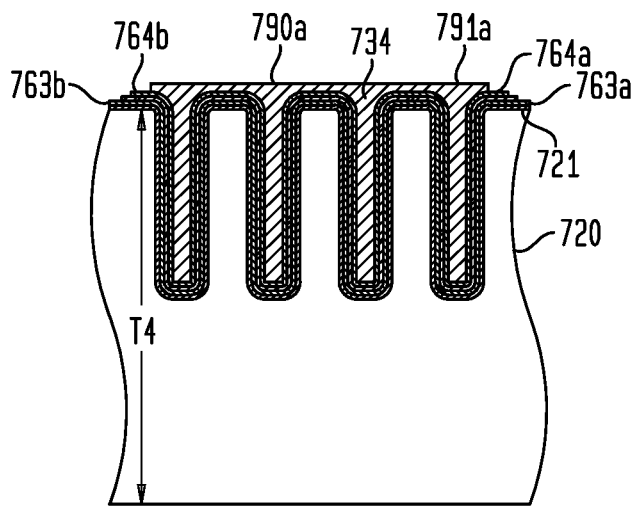

A method of fabricating the component 710 (FIG. 18) will now be described, with reference to FIGS. 19A-19M. As illustrated in FIG. 19A, material can be removed from the first surface 721 of the substrate 720 to form a plurality of first openings 734 extending from the first surface towards the second surface 722, the first openings defining an undulating inner surface 735 and substrate boundary surfaces 731 (similar to FIG. 14A). The first openings 734 can be formed using similar methods as those described above with respect to FIG. 2A.

Thereafter, as illustrated in FIG. 19B, an insulating dielectric layer 750 is formed overlying the undulating inner surface 735, the substrate boundary surfaces 731, and portions of the first surface 721. The insulating dielectric layer 750 has an undulating first surface 736 facing away from the inner surface 735. The insulating dielectric layer 750 can be formed using similar methods as those described above with respect to FIG. 2B.

Thereafter, as illustrated in FIG. 19C, the first electrically conductive element 760 can be formed overlying the undulating first surface 736 of the insulating dielectric layer 750 and extending into each of the first openings 734. The first electrically conductive element 760 can have an undulating shape and can define a surface that conforms to a contour of the undulating first surface 736. The first conductive element 760 can be formed using similar methods as those described above with respect to FIG. 2C. The first conductive element 760 can be connected to the first and second electrodes 763*a* and 763*b*, the first and second electrodes being exposed at the first surface 721.

Thereafter, as illustrated in FIG. 19D, the first capacitor dielectric layer 780*a* is formed overlying the first electrically conductive element 760 and extending into each of the first openings 734. Lateral edges 781*a* and 782*a* of the capacitor dielectric layer 780*a* can be formed such that end portions 760*a* and 760*b* of the first conductive element 760 can extend laterally beyond the lateral edges 781*a* and 782*a*, such that the end portions 760*a* and 760*b* can be exposed at the first surface 721 for connection to the respective first and second electrodes 763*a* and 763*b* or can serve as the respective first and second electrodes. The first capacitor dielectric layer dielectric layer 780*a* can be formed using similar methods as those described above with respect to FIG. 2B.

Thereafter, as illustrated in FIG. 19E, the second electrically conductive element 761 can be formed overlying the first capacitor dielectric layer 780*a* and extending into each of the first openings 734. The second conductive element 761 can have an undulating shape. The second conductive element 761 can be formed using similar methods as those described above with respect to FIG. 2C. The second conductive element 761 can be connected to the third and fourth electrodes 764*a* and 764*b*, the third and fourth electrodes being exposed at the first surface 721.

Thereafter, as illustrated in FIG. 19F, the first dielectric region 790*a* can be formed inside each of the first openings 734 and partially overlying the first surface 721 of the substrate 720. The first dielectric region 790*a* can be formed using similar methods as described above with reference to the dielectric region 90 (FIG. 1). The first dielectric region 790*a* can be deposited such that the first, second, third, and fourth electrodes 763*a*, 764*a*, 763*b*, and 764*b* are exposed at the outer surface 791*a* of the first dielectric region.

Figure 19G:
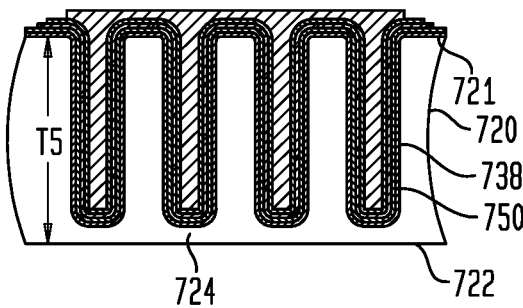

Thereafter, as illustrated in FIG. 19G, the thickness of the substrate 720 between the first and second surfaces 721 and 722 can be reduced. However, the undulating second surface 738 of the insulating dielectric layer 750 is not exposed, whereby a portion 724 of the substrate remains between the insulating dielectric layer and the second surface 722. Grinding, lapping, or polishing of the second surface 722 or a combination thereof can be used to reduce the thickness of the substrate 720. During this step, as an example, the initial thickness T4 (shown in FIG. 19F) of the substrate 720 can be reduced from about 700 μm to a thickness T5 (shown in FIG. 19G) of about 130 μm or less.

Figure 19H:
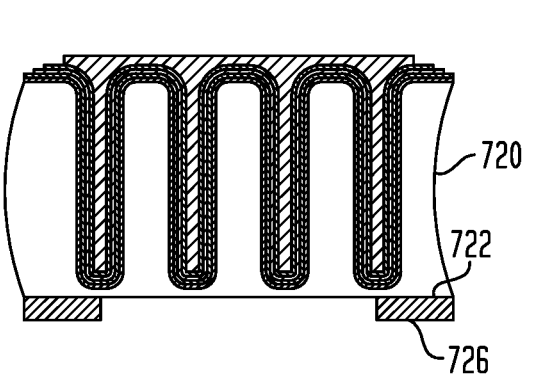

Thereafter, as illustrated in FIG. 19H, a mask layer 726 can be applied to the second surface 722 of the substrate 720 where it is desired to preserve remaining portions of the second surface, in a manner similar to that described with reference to FIG. 16B.

Figure 19I:
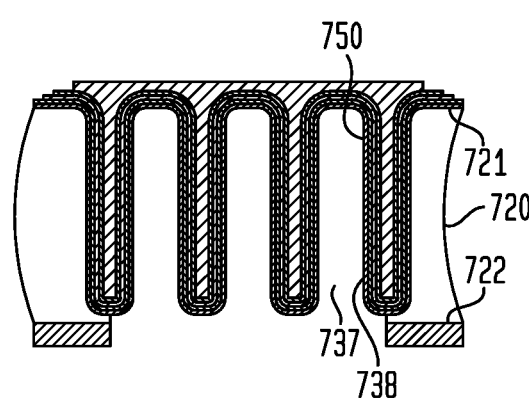

Thereafter, as illustrated in FIG. 19I, material can be removed from the second surface 722 of the substrate 720 to expose the undulating second surface 738 of the insulating dielectric layer 750, thereby forming a plurality of second openings 737 extending from the second surface towards the first surface 721. The second openings 737 can be formed using similar methods as those described above with respect to FIG. 2A.

Figure 19J:
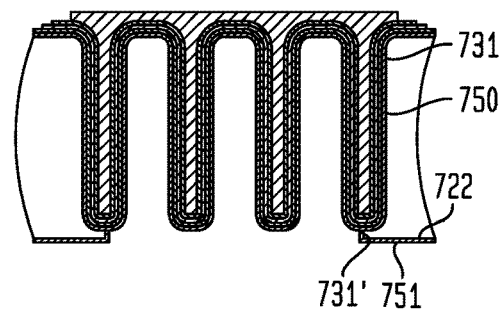

Thereafter, as illustrated in FIG. 19J, the mask layer 726 can be removed, and additional portions 751 of the insulating dielectric layer 750 can be formed overlying the second surface 722 and exposed portions 731' (FIG. 19I) of the substrate boundary surfaces 731. The additional portions 751 of the insulating dielectric layer 750 can be formed using similar methods as those described above with respect to FIG. 2B.

Figure 19K:
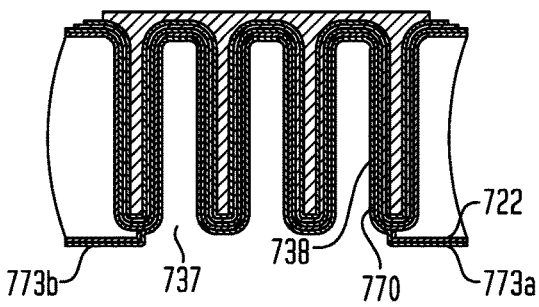

Thereafter, as illustrated in FIG. 19K, the third electrically conductive element 770 can be formed overlying the undulating second surface 738 of the insulating dielectric layer 750 and extending into each of the second openings 737. The third electrically conductive element 770 can have an undulating shape and can define a surface that conforms to a contour of the undulating second surface 738. The third conductive element 770 can be formed using similar methods as those described above with respect to FIG. 2C. The third conductive element 770 can be connected to the fifth and sixth electrodes 773*a* and 773*b*, the fifth and sixth electrodes being exposed at the second surface 722.

Figure 19L:
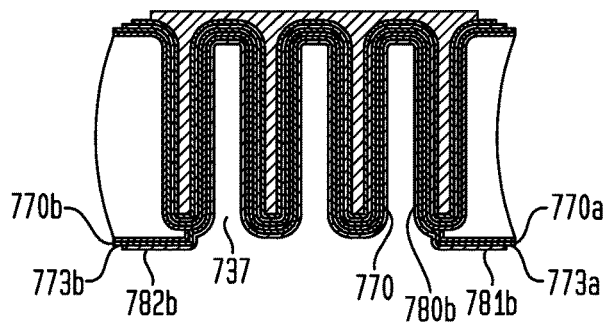

Thereafter, as illustrated in FIG. 19L, the second capacitor dielectric layer 780*b* is formed overlying the third electrically conductive element 770 and extending into each of the second openings 737. Lateral edges 781*b* and 782*b* of the capacitor dielectric layer 780*b* can be formed such that end portions 770*a* and 770*b* of the third conductive element 770 can extend laterally beyond the lateral edges 781*b* and 782*b*, such that the end portions 770*a* and 770*b* can be exposed at the second surface 722 for connection to the respective fifth and sixth electrodes 773*a* and 773*b* or can serve as the respective fifth and sixth electrodes. The second capacitor dielectric layer dielectric layer 780*b* can be formed using similar methods as those described above with respect to FIG. 2B.

Figure 19M:
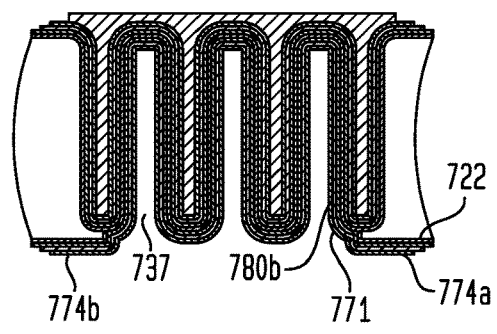

Thereafter, as illustrated in FIG. 19M, the fourth electrically conductive element 771 can be formed overlying the second capacitor dielectric layer 780*b* and extending into each of the second openings 737. The fourth conductive element 771 can have an undulating shape. The fourth conductive element 771 can be formed using similar methods as those described above with respect to FIG. 2C. The fourth conductive element 771 can be connected to the seventh and eighth electrodes 774*a* and 774*b*, the seventh and eighth electrodes being exposed at the second surface 722.

Thereafter, referring again to FIG. 18, the second dielectric region 790b can be formed inside each of the second openings 737 and partially overlying the second surface 722 of the substrate 720. The second dielectric region 790b can be formed using similar methods as described above with reference to the dielectric region 90 (FIG. 1). The second dielectric region 790b can be deposited such that the fifth, sixth, seventh, and eighth electrodes 773a, 774a, 773b, and 774b are exposed at the outer surface 791b of the second dielectric region.

FIG. 20A illustrates an example top-down plan view that can correspond to the components shown in FIGS. 1 and 7A. A component 810 according to an embodiment of the invention includes a substrate 820 and a plurality of capacitors 840 formed in contact with the substrate. The substrate 820 includes a plurality of substantially circular openings 830 extending downwardly from a planar first surface 821. Each capacitor 840 includes a first pair of electrically conductive plates 860 and a second pair of electrically conductive plates 870. A dielectric region 890 overlies the plates 860 and 870 at least within the corresponding opening 830.

In one embodiment (for example, corresponding to the embodiment shown in FIG. 1), a first pair of plates 860 can be connected to a first electrode 863 exposed at the first surface 821 of the substrate 820, the first electrode being connectable with a first electric potential. The second pair of plates 870 can be connected to a second electrode 873 exposed at the first surface 821 of the substrate 820, the second electrode being connectable with a second electric potential.

In an alternate embodiment (for example, corresponding to the embodiment shown in FIG. 7A), a first capacitor 840a and a second capacitor 840b can extend through a single substantially circular through opening 830' between the first surface 821 of the substrate 820 and a second planar surface opposite the first surface. In such an embodiment, a first pair of plates 860a of the first capacitor 840a can be connected to a first electrode 863a exposed at the first surface 821, and a second pair of plates 860b of the second capacitor 840b can be connected to a first electrode 863b exposed at the first surface 821. A second pair of plates of the first capacitor can be connected to a second electrode exposed at the second surface, and a second pair of plates of the second capacitor can be connected to a second electrode exposed at the second surface.

FIG. 20B illustrates another example top-down plan view that can correspond to the components shown in FIGS. 3A and 7A. A component 910 according to an embodiment of the invention includes a substrate 920 and a plurality of capacitors 940 formed in contact with the substrate. The substrate 920 includes a plurality of substantially square openings 930 extending downwardly from a planar first surface 921. Each capacitor 940 includes a first pair of electrically conductive plates 960 and a second pair of electrically conductive plates 970. A dielectric region 990 overlies the plates 960 and 970 at least within the corresponding opening 930.

In one embodiment (for example, corresponding to the embodiments shown in FIGS. 3A), a first pair of plates 960 can be connected to a first electrode 963 and a second electrode 964 exposed at the first surface 921 of the substrate 920, the first and second electrodes being connectable with a first electric potential. The second pair of plates 970 can be connected to a third electrode 973 and a fourth electrode 974 exposed at the first surface 921.

In one embodiment (for example, corresponding to the embodiments shown in FIGS. 7A), a first pair of plates 960' can be connected to a first electrode 963' and a second electrode 964' exposed at the first surface 921 of the substrate 920 and third and fourth electrodes exposed at a second planar surface (not shown in FIG. 20B) opposite the first surface, whereby the first, second, third, and fourth electrodes can be connectable with a first electric potential. The second pair of plates 970' can be connected to a fifth electrode 973' and a sixth electrode 974' exposed at the first surface 921 of the substrate 920 and seventh and eighth electrodes exposed at the second planar surface, whereby the fifth, sixth, seventh, and eighth electrodes can be connectable with a second electric potential.

FIG. 20C illustrates an example top-down plan view that can correspond to the components shown in FIGS. 1 and 7A. A component 1010 according to an embodiment of the invention includes a substrate 1020 and a plurality of capacitors 1040 formed in contact with the substrate. The substrate 1020 includes a plurality of substantially rectangular or channel-shaped openings 1030 extending downwardly from a planar first surface 1021. Each capacitor 1040 includes a first pair of electrically conductive plates 1060 and a second pair of electrically conductive plates 1070. A dielectric region 1090 overlies the plates 1060 and 1070 at least within the corresponding opening 1030.

In one embodiment (for example, corresponding to the embodiment shown in FIG. 1), a first pair of plates 1060 can be connected to a first electrode 1063 exposed at the first surface 1021 of the substrate 1020, the first electrode being connectable with a first electric potential. The second pair of plates 1070 can be connected to a second electrode 1073 exposed at the first surface 1021 of the substrate 1020, the second electrode being connectable with a second electric potential.

In an alternate embodiment (for example, corresponding to the embodiment shown in FIG. 7A), a first capacitor 1040a and a second capacitor 1040b can extend through a single substantially rectangular or channel-shaped through opening 1030' between the first surface 1021 of the substrate 1020 and a second planar surface opposite the first surface. In such an embodiment, a first pair of plates 1060a of the first capacitor 1040a can be connected to a first electrode 1063a exposed at the first surface 1021, and a second pair of plates 1060b of the second capacitor 1040b can be connected to a first electrode 1063b exposed at the first surface 1021. A second pair of plates of the first capacitor can be connected to a second electrode exposed at the second surface, and a second pair of plates of the second capacitor can be connected to a second electrode exposed at the second surface.

FIG. 20D illustrates an example top-down plan view that can correspond to the components shown in FIGS. 1, 3A, 7A, 11, 13, and 15. A component 1110 according to an embodiment of the invention includes a substrate 1120 and a plurality of capacitors 1140 formed in contact with the substrate. The substrate 1120 includes a plurality of openings 1130 extending downwardly from a planar first surface 1121. The plurality of openings 1130 can include openings 1130a having a square shape, openings 1130b having a round shape, an opening 1130c having a rectangular shape, and openings 1130d and 1130e having irregular shapes. An example capacitor 1140f can extend through a plurality of openings 1130f.

Figure 21:
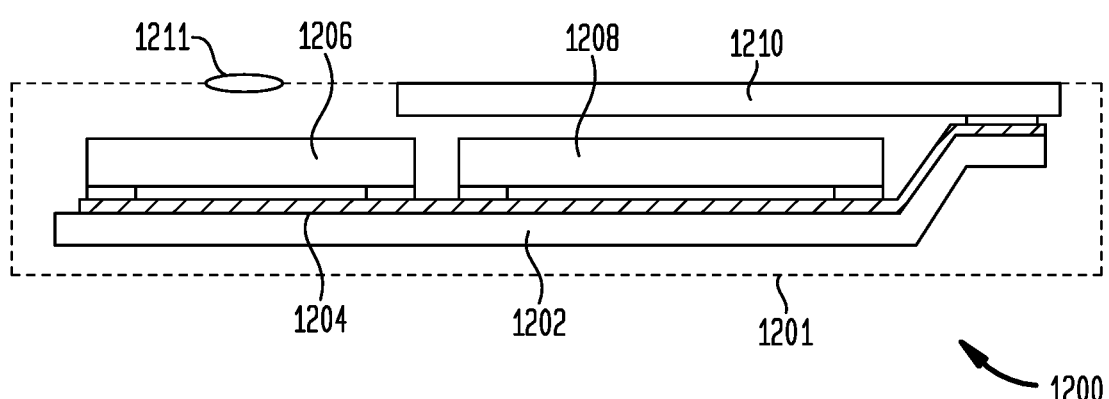
FIG. 21 is a schematic depiction of a system according to one embodiment of the invention.

The microelectronic assemblies described above can be utilized in construction of diverse electronic systems, as shown in FIG. 21. For example, a system 1200 in accordance with a further embodiment of the invention includes a microelectronic assembly 1206 as described above in conjunction with other electronic components 1208 and 1210. In the example depicted, component 1208 is a semiconductor chip whereas component 1210 is a display screen, but any other components can be used. Of course, although only two additional components are depicted in FIG. 21 for clarity of illustration, the system may include any number of such components. The microelectronic assembly 1206 may be any of the assemblies described above. In a further variant, any number of such microelectronic assemblies may be used.

Microelectronic assembly 1206 and components 1208 and 1210 are mounted in a common housing 1201, schematically depicted in broken lines, and are electrically interconnected with one another as necessary to form the desired circuit. In the exemplary system shown, the system includes a circuit panel 1202 such as a flexible printed circuit board, and the circuit panel includes numerous conductors 1204, of which only one is depicted in FIG. 21, interconnecting the components with one another. However, this is merely exemplary; any suitable structure for making electrical connections can be used.

The housing 1201 is depicted as a portable housing of the type usable, for example, in a cellular telephone or personal digital assistant, and screen 1210 is exposed at the surface of the housing. Where structure 1206 includes a light-sensitive element such as an imaging chip, a lens 1211 or other optical device also may be provided for routing light to the structure. Again, the simplified system shown in FIG. 21 is merely exemplary; other systems, including systems commonly regarded as fixed structures, such as desktop computers, routers and the like can be made using the structures discussed above.

The openings and conductive elements disclosed herein can be formed by processes such as those disclosed in greater detail in the co-pending, commonly assigned U.S. patent application Ser. Nos. 12/842,587, 12/842,612, 12/842,651, 12/842,669, 12/842,692, and 12/842,717, filed Jul. 23, 2010, and in published U.S. Patent Application Publication No. 2008/0246136, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic element, comprising:
a substrate having an upper planar surface, an opposite lower planar surface, and a side surface, wherein the upper planar surface comprises a circuit element and wherein the upper planar surface and the lower planar surface are perpendicular to the side surface;

a first dielectric layer at least partially disposed in the substrate between the upper planar surface and the lower planar surface, the first dielectric layer comprising an undulating shape that has a first side and an opposite second side, wherein the undulating shape extends downwardly with respect to the upper planar surface and extends upwardly with respect to the lower planar surface when viewed from a perspective of the side surface;

a first electrically conductive layer disposed on the first side of the first dielectric layer, wherein the first electrically conductive layer conforms to the undulating shape of the first dielectric layer;

a second electrically conductive layer and a third electrically conductive layer disposed on the second side of the first dielectric layer, wherein the second and third electrically conductive layers conform to the undulating shape of the first dielectric layer;

a second dielectric layer disposed between the second electrically conductive layer and the third electrically conductive layer; and a plurality of first electrodes electrically connected to the first electrically conductive layer, a second electrode electrically connected to the second electrically conductive layer, and a third electrode electrically connected to the third electrically conductive layer.

2. The microelectronic element as claimed in claim 1, wherein undulating portions of the first dielectric layer extend downwardly from the upper planar surface of the substrate to locations proximate to the lower planar surface.

3. The microelectronic element as claimed in claim 1, wherein the substrate is at a ground potential.

4. The microelectronic element as claimed in claim 1, wherein the substrate comprises silicon.

5. The microelectronic element as claimed in claim 1, wherein the second electrode is connected to an outer portion of the second electrically conductive layer; and
the third electrode is connected to an outer portion of the third electrically conductive layer.

6. The microelectronic element as claimed in claim 5, wherein:
the first electrically conductive layer, the second electrically conductive layer, the third electrically conductive layer, the first dielectric layer, and the second dielectric layer are disposed in one or more openings formed in the substrate; and
the plurality of first electrodes are connected to corresponding locations on the first electrically conductive layer that are radially inward from connection locations of the second and third electrodes to the second and third electrically conductive layers.

7. The microelectronic element as claimed in claim 1, wherein when the microelectronic element is in use, the plurality of first electrodes and the third electrode are connected with a first electric potential and the second electrode is connected with a second electric potential.

8. The microelectronic element as claimed in claim 1, wherein the undulating shape comprises a peak and a trough, and wherein the peak is closer to the upper planar surface than the trough.

9. The microelectronic element as claimed in claim 1, wherein the circuit element is disposed at and below the upper planar surface.

* * * * *